(12) United States Patent
Masoud et al.

(10) Patent No.: US 11,468,207 B2
(45) Date of Patent: Oct. 11, 2022

(54) SYSTEMS AND METHODS FOR SIMULATION-BASED RESOURCE AND LAYOUT OPTIMIZATION

(71) Applicant: Arizona Board of Regents on Behalf of the University of Arizona, Tucson, AZ (US)

(72) Inventors: Sara Masoud, Tucson, AZ (US); Young-Jun Son, Tucson, AZ (US); Russell E. Tronstad, Tucson, AZ (US); Chieri Kubota, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 732 days.

(21) Appl. No.: 16/418,883

(22) Filed: May 21, 2019

(65) Prior Publication Data

US 2019/0354641 A1 Nov. 21, 2019

Related U.S. Application Data

(60) Provisional application No. 62/674,574, filed on May 21, 2015.

(51) Int. Cl.
*G06F 30/13* (2020.01)
*G06Q 10/06* (2012.01)
*G06Q 10/04* (2012.01)
*G06F 30/20* (2020.01)

(52) U.S. Cl.
CPC .............. *G06F 30/13* (2020.01); *G06F 30/20* (2020.01); *G06Q 10/043* (2013.01); *G06Q 10/0633* (2013.01); *G06Q 10/06393* (2013.01)

(58) Field of Classification Search
CPC ....... G06F 30/13; G06F 30/20; G06Q 10/043; G06Q 10/0633; G06Q 10/06393
See application file for complete search history.

(56) References Cited

U.S. PATENT DOCUMENTS

| 7,725,857 B2 * | 5/2010 | Foltz | G06Q 10/06 716/119 |
| 2002/0193972 A1 * | 12/2002 | Kudo | G05B 19/41885 703/1 |

OTHER PUBLICATIONS

Jerin Leno, I., Saravana Sankar, S. & Ponnambalam, S.G. MIP model and elitist strategy hybrid GA-SA algorithm for layout design. J Intell Manuf 29, 369-387 (2018) (Year: 2018).*
Pourhassan et al. "An integrated simulation-based optimization technique for multi-objective dynamic facility layout problem". Journal of Industrial Information Integration 8 (2017) 49-58. (Year: 2017).*
Hailemariam. "Redesign of the Layout and the Materials Flow of a Production Plant". Department of Operational Methods for Production and Logistics Industrial Engineering and Management University of Twente, Enschede, the Netherlands. 93 Pages. (Year: 2010).*
Jaafari et al. "A Multi-Objective Formulation for Facility Layout Problem". Proceedings of the World Congress on Engineering and Computer Science 2009 vol. II WCECS 2009, Oct. 20-22, 2009. 6 Pages. (Year: 2009).*

(Continued)

*Primary Examiner* — Eunhee Kim
(74) *Attorney, Agent, or Firm* — Polsinelli PC

(57) ABSTRACT

A simulation-based framework for optimizing resource allocation and layout design is disclosed.

7 Claims, 17 Drawing Sheets

(56) References Cited

OTHER PUBLICATIONS

Shah et al. "Dynamic Facility Planning under Production and Material Handling Capacity Constraints". Journal of Supply Chain and Operations Management, vol. 13, No. 1, Feb. 2015. 30 Pages. (Year: 2015).*
Suo et al. "Modeling and Simulating of Facility Layout based on Manufacturing Costs". 2011 International Conference on Electronic & Mechanical Engineering and Information Technology. 5 Pages. (Year: 2011).*
Chen et al. "Managing Dynamic Facility Layout with Multiple Objectives". PICMET 2009 Proceedings, Aug. 2-6, 2009.10 Pages. (Year: 2009).*
Aleisa, E. E., Lin, L. 2005. For effective facilities planning: layout optimization then simulation, or vice versa? In Proceedings of the 37th Winter Simulation Conference. 1381-1385.
Alexandratos, N., & Bruinsma, J. 2012. World agriculture towards 2030/2050: the 2012 revision (No. 12-03, p. 4). Rome, FAO: ESA Working paper.
Aldrich, Robert A., and John W. Bartok. Greenhouse engineering. No. 635.9823 A365g. New York, US: Northeast Regional Agricultural Engineering Service, 1994.
Azadivar, F., & Wang, J. 2000. Facility layout optimization using simulation and genetic algorithms. International Journal of Production Research, 38(17), 4369-4383.
Benjaafar, S., & Sheikhzadeh, M. 2000. Design of flexible plant layouts. IIE Transactions, 32(4), 309-322.
Calvin L., Martin P. 2010. The U.S. produce industry and labor. Facing the future in a global economy. ERR-106. U.S. Department of Agriculture, Economic Research Service, Nov. 2010.
Chica, M., Bautista, J., Cordon, Ó., & Damas, S. 2016. A multiobjective model and evolutionary algorithms for robust time and space assembly line balancing under uncertain demand. Omega, 58, 55-68.
E Silva, L. C., & Costa, A. P. C. S. 2013. Decision model for allocating human resources in information system projects. International Journal of Project Management, 31(1), 100-108.
Eben-Chaime, M., Bechar, A., & Baron, A. 2011. Economical evaluation of greenhouse layout design. International Journal of Production Economics, 134(1), 246-254.
Emde, S., & Boysen, N. 2012. Optimally locating in-house logistics areas to facilitate JIT-supply of mixed-model assembly lines. International Journal of Production Economics, 135(1), 393-402.
Guyon, O., Lemaire, P., Pinson, E., & Rivreau, D. 2014. Solving an integrated job-shop problem with human resource constraints. Annals of Operations Research, 213(1), 147-171.
Kubota, C., Meng, C., Masoud, S., Son, Y.J. and Tronstad, R., 2019. Advanced Technologies for Large-Scale Plant Factories— Integration of Industrial and Systems Engineering Approach in Controlled Environment Crop Production. In Plant Factory Using Artificial Light, 353-362.
Lee, J. M., Kubota, C., Tsao, S. J., Bie, Z., Echevarria, P. H., Morra, L., & Oda, M. 2010. Current status of vegetable grafting: Diffusion, grafting techniques, automation. Scientia Horticulturae, 127(2), 93-105.
Louws, F. J., Rivard, C. L., & Kubota, C. 2010. Grafting fruiting vegetables to manage soilborne pathogens, foliar pathogens, arthropods and weeds. Scientia Horticulturae, 127(2), 127-146.
Masoud, S., Son, Y. J., Kubota, C., & Tronstad, R. 2018. Evaluation of Simulation based Optimization in Grafting Labor Allocation. Applied Engineering in Agriculture. 34(3): 479-489.
Paes, F. G., Pessoa, A. A., & Vidal, T. 2017. A hybrid genetic algorithm with decomposition phases for the Unequal Area Facility Layout Problem. European Journal of Operational Research, 256(3), 742-756.
Pillai, V. M., Hunagund, I. B., & Krishnan, K. K. 2011. Design of robust layout for dynamic plant layout problems. Computers & Industrial Engineering, 61(3), 813-823.
Pröpster, M., März, L., Reinhart, G., & Intra, C. 2015. Validation of Line Balancing by Simulation of Workforce Flexibility. Procedia CIRP, 33, 93-98.
Saraswat, A., Venkatadri, U., & Castillo, I. (2015). A framework for multi-objective facility layout design. Computers & Industrial Engineering, 90, 167-176.
Shankar, B. L., Basavarajappa, S., Chen, J. C., & Kadadevaramath, R. S. 2013. Location and allocation decisions for multi-echelon supply chain network—A multi-objective evolutionary approach. Expert Systems with Applications, 40(2), 551-562.
Shivhare, M., & Bansal, S. 2014. Layout Optimization in Flexible Manufacturing System using Particle Swarm Optimization in Matlab. International Journal of Software Engineering and Its Application, 8(7), 55-64.
Singh, S. P., & Sharma, R. R. 2006. A review of different approaches to the facility layout problems. The International Journal of Advanced Manufacturing Technology, 30(5-6), 425-433.
Stoddard, F. L., McCully M. E. 1979. Histology of the development of the graft union in pea roots. Canadian Journal of Botany 57.14, 1486-1501.
Stummer, C., Doerner, K., Focke, A., & Heidenberger, K. 2004. Determining location and size of medical departments in a hospital network: A multiobjective decision support approach. Health Care Management Science, 7(1), 63-71.
Sule, D. R. 2008. Manufacturing facilities: location, planning, and design. CRC press.
Tompkins, J. A., White, J. A., Bozer, Y. A., & Tanchoco, J. M. A. 2010. Facilities planning. John Wiley & Sons.
Trenberth, K. E., Dai, A., Van Der Schrier, G., Jones, P. D., Barichivich, J., Briffa, K. R., & Sheffield, J. 2014. Global warming and changes in drought. Nature Climate Change, 4(1), 17-22.
Vilarinho, P. M., & Guimaraes, R. C. 2003. A facility layout design support system. Investigacao Operacional, 23(2), 145-161.
Wu, Y. K., Lee, C. Y., Chen, C. R., Hsu, K. W., & Tseng, H. T. 2014. Optimization of the Wind Turbine Layout and Transmission System Planning for a Large-Scale Offshore WindFarm by AI Technology. IEEE Transactions on Industry Applications, 50(3), 2071-2080.
Zupan, H., & Herakovic, N. 2015. Production line balancing with discrete event simulation: A case study. IFAC—PapersOnLine, 48(3), 2305-2311.

\* cited by examiner

FIG. 5

SYSTEMS AND METHODS FOR SIMULATION-BASED RESOURCE AND LAYOUT OPTIMIZATION

CROSS REFERENCE TO RELATED APPLICATIONS

This is a U.S. non-provisional patent application that claims benefit to U.S. provisional patent application Ser. No. 62/674,574 filed on May 21, 2018, which is incorporated by reference in its entirety.

FEDERALLY FUNDED RESEARCH

This invention was made with government support under Grant Nos. 2016-33610-25689 and 2016-51181-25404 awarded by USDA/NIFA. The government has certain rights in the invention.

FIELD

The present disclosure generally relates to technical improvements associated with computer-implemented modeling for facility design and resource allocation; and in some aspects relates to a computerized framework for simulation-based resource and layout optimization.

BACKGROUND

Population growth, changes in food consumption patterns, reductions in rural labor and pesticide availability, and climate change are key challenges facing agriculture. Multiple technologies and techniques such as smart agriculture, budding and grafting have been introduced, at least in part, to help address these challenges. Approaches such as grafting and budding are often important for increasing a cultivars' yield.

Grafting is one of the many processes that are performed in a vegetable seedling propagation facility. Grafting is a method of plant propagation in which parts of different plants (i.e., rootstock and scion) are joined together with the ultimate goal of making a superior plant in terms of quantity and quality with root resistance toward pests and diseases. Grafting can produce better productivity and higher tolerance against both biotic and abiotic stresses. However, among all the processes such as seeding, germination, growing, healing, and acclimatization, grafting is the most labor-intensive task as it requires a high level of labor and expertise to implement. For example, once an appropriate environment for producing compatible scions and rootstocks is developed, managing labor and equipment resources are then key for making successful grafts with lower costs.

Overall, the process of grafting and other processes for plant propagation are implemented with the goal of maximizing production output of a facility. This goal is shared by administrators of other types of facilities, such as a manufacturing facility, where outputs must be maximized similar to plant propagation. Unfortunately, current technology does not sufficiently accommodate the optimization of labor management and equipment resources. It is with these observations in mind, among others, that various aspects of the present disclosure were conceived and developed.

BRIEF DESCRIPTION OF THE DRAWINGS

FIG. 5 illustrates the structure of the distance, frequency, and cost matrixes.

Corresponding reference characters indicate corresponding elements among the view of the drawings. The headings used in the figures do not limit the scope of the claims.

DETAILED DESCRIPTION

Introduction

Figure 1A:
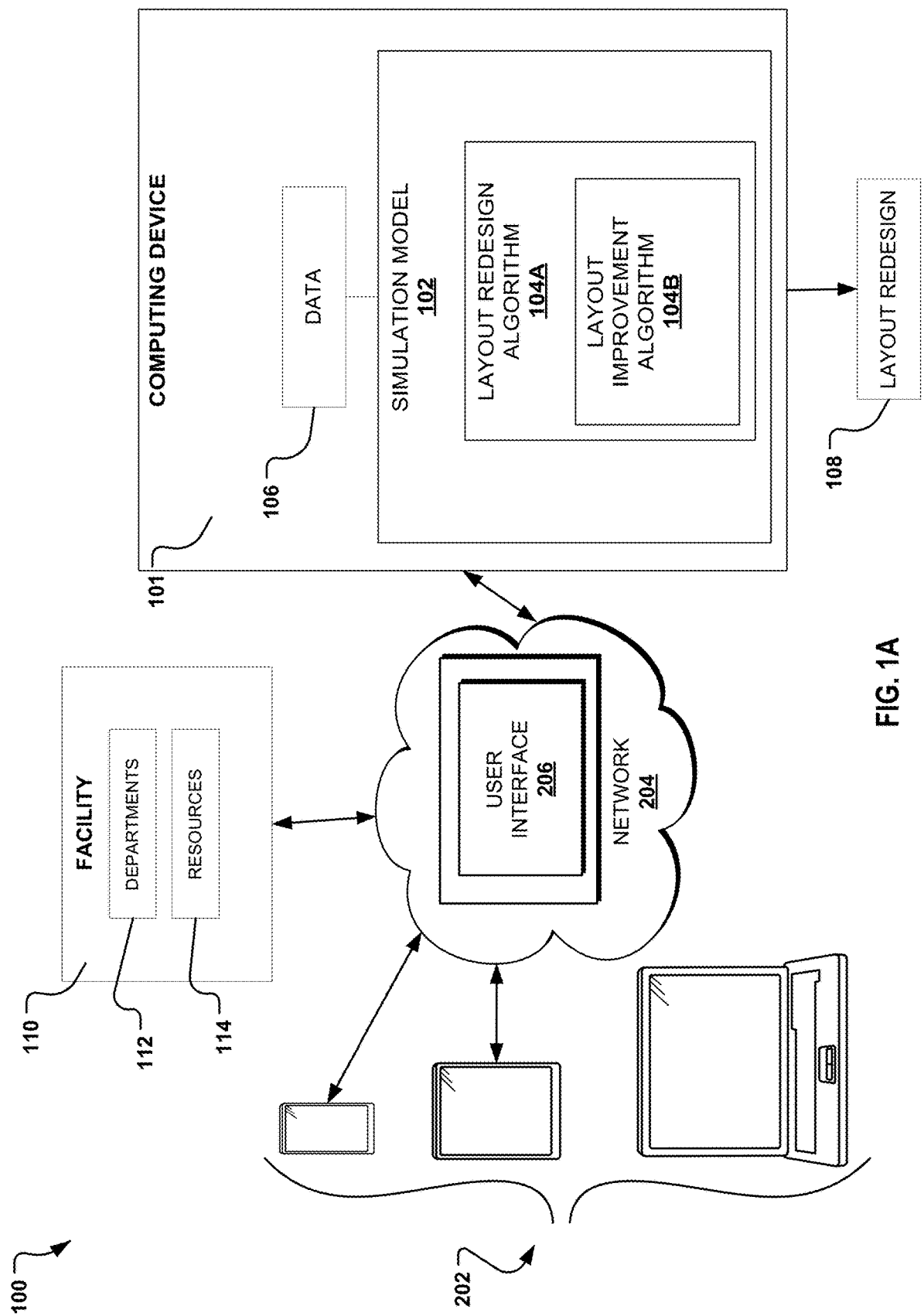
FIG. 1A is a system/network diagram illustrating possible components of the described simulation-based optimization framework.

Computer-implemented analysis of material handling and production procedures may involve various technical complications. For example, resource planning in vegetable seedling propagation facilities is complicated due to the dynamicity of workers' performance. In addition, the negative impact of an inefficient layout on workers' performance reduces the productivity in vegetable seedling propagation facilities substantially. In the present document, a technical solution in the form of a computerized simulation-based optimization framework is described which may generally comprise a computing device configured to execute a simulation model and a plurality of layout design algorithms which accommodates optimal layout-based resource allocation. In some embodiments, the layout design algorithms are embedded within or are otherwise integrated with the simulation model in order to find an optimal layout design given resources available. The proposed simulation model may be customized based on workers' individual performance and managerial design preferences.

Managing labor and equipment resources are key objectives for making successful grafts with lower costs or for other processes of plant propagation, or otherwise maximizing production in a general facility. The strong relation between different departments raises the need for resource balancing among different tasks and processes to maximize production output within a facility. In addition to line balancing, the layout design of the facility affects the production capacity for a given production line as well.

In general, the present inventive concept relates to the discovery that resource allocation and layout design are related problems. In any facility, the size of a department depends on the number of workers and robots that are placed in the mentioned departments which means, the layout design is directly related to resource allocation and line balancing. At the same time, resource productivity depends on the size of a department due to influential factors such as material handling time. This is especially pertinent for a vegetable propagation facility where just a one-man wholesale operation requires a minimum space of about 500 square meters. An optimal resource allocation results from a balanced line where labor and equipment tasks are assigned such that bottlenecks do not occur. Thus, for a truly balanced line the impacts of layout also need to be considered.

The layout-based resource allocation framework associated with the inventive concept described herein considers these impacts of layout design in resource allocation and line balancing. Simulation not only enables the modeling of the uncertainty caused by humans' performance, but also accommodates the definition of all the processes and interactions of the resources in great detail. In addition, the layout design algorithms described herein may be embedded in the simulation model to find the optimal layout design for the allocated resources. Building an optimization model on top of the simulation model accommodates the determination of a suitable, optimal, or best allocation of labor and equipment resources according to a predetermined production output threshold. In other words, the proposed framework allows one to simultaneously find an optimal resource allocation and layout design.

Considerations

Like many other production facilities, vegetable seedling propagation facilities consist of multiple departments. Consequently, determining the size and layout of each department raises a Facility Design Problem (FDP). At the same time, each department is generally assigned to a specific task and space is a perquisite for achieving the pre-assigned task. FDP and resource allocation have not been addressed as an integrated problem. The FDP includes the design of both the layout and material handling system. A good layout design requires a precise estimate of each department's size which also depends on the resources (i.e., labor and robots) allocated to that specific department. At the same time, the performance of each resource depends on the functionality of material handling which relies on a department's size.

Some approaches to FDPs may address the minimization of material handling costs as a prime objective. In addition, since a reduction in material handling results in lower flow time, work-in-process inventory, total congestion, product damage, and simplified planning, it becomes a very common objective for most of FDPs. But, the minimization of material cost as an objective by itself is not sufficient in some cases due to its ignorance of empty material transfer, which generally increases work-in-process and equipment costs. Since material flows from one department to another, FDPs may be related to line balancing to ensure that the transition of materials between departments avoids any bottleneck. However, an optimized solution for a specific configuration may not be optimal where different variants of products need to be handled in the same production line.

Exemplary Design and Methodology

Referring to FIG. 1A, one example of the described computerized simulation-based optimization framework (hereinafter "framework") 100 is illustrated. As indicated, the framework 100 may generally be implemented in the form of at least one computing device 101, which may be configured with a simulation model 102 and a plurality of optimization algorithms 104 such that the computing device 101 is operable to execute operations associated with simulation based optimization, as described herein. In other words, the simulation model 102 and the optimization algorithms 104 may be embodied as software code installed to or otherwise executable by the computing device 101. As shown, the optimization algorithms may include a layout redesign algorithm 104A, and a layout improvement algorithm 104B, which may be integrated with the simulation model 102. The simulation model 102 and the optimization algorithms 104 may leverage information from data 106, which may include a plurality of different parameters and historical data associated with at least one facility that may be fed to the simulation model 102 and may be applied by the optimization algorithms 104 in some form. For example, in some embodiments, the computing device 101 may execute aspects of the simulation model 102 and the optimization algorithms 104 to generate an initial layout, and then optimize the initial layout or otherwise generate a layout redesign 108 that is determined to be optimal based on predetermined desired output specifications. In some embodiments, the layout redesign 108 may include a plurality of parameters or other information for optimizing a layout and resource allocation for a facility 110, such that the layout redesign 108 may define a desired topology (size, position, and orientation) of the departments 112 of the facility 110, and allocation of resources 114 for the departments 112 of the facility 110.

Figure 1B:
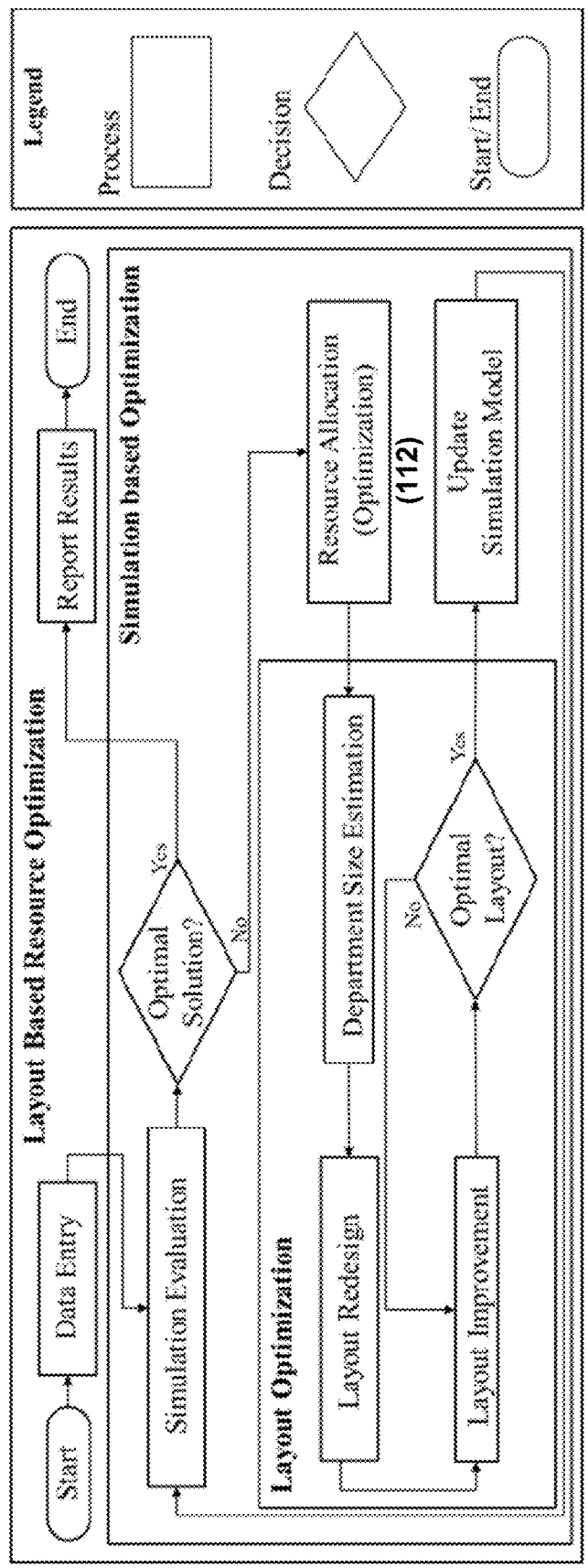
FIG. 1B is a logic diagram associated with the computerized framework configured for simulation-based resource and layout optimization as described herein.

Referring to FIG. 1B, a process associated with the framework 100 is illustrated. In some embodiments, the process may start with data entry which may include not only historical datasets and predetermined parameters for developing an optimum layout design and resource allocation of the facility under study, but also an initialized/initial design layout may be defined based on these mentioned parameters. In some embodiments, this step may include feeding historical information about the facility to the simulation model 102. In this step, the actual layout, number of resources (e.g., workers), and also individual areas (space) of the facility may be unknown so the framework 100 may allocate/suggest a feasible layout even though it may not be optimal. Given this suggested layout, a simulation may be executed by the simulation model 102 or otherwise to evaluate the status of the initial layout before optimizing the layout and resource allocation. Next, as indicated, the optimization part of the framework 100 (i.e., Resource Allocation) may assign a different number of resources (e.g., workers) to each department for different tasks. The simulation model 102 may then run again to decide whether this initial layout setup (i.e., combination of the initialized layout design and resource allocation) is feasible. If this initial setup is feasible, the framework 100 will continue to find a better setting until it concludes it as an optimal solution. But, if it is infeasible, the framework 100 may continue searching for a feasible resource allocation given the initialized layout design. This part will be discussed in greater detail in the optimization modelling section.

After attaining a feasible resource allocation, the framework 100 is operable to estimate the size of each department considering the number of workers, equipment, and a pre-assigned standard space for each resource. The summation of those pre-assigned standard spaces over all the resources within each department defines the size of the department. Given the size of each department, a new layout (e.g., layout redesign 108) may be generated by the layout redesign algorithm 104A. The main purpose of this algorithm is to generate a feasible layout. Afterwards, the layout improvement algorithm 104B will try to enhance the layout suggested by the redesign algorithm 104A through exchanging the location of adjacent departments. The optimal layout design is the one that has the best score through all the possible cases examined by the layout improvement algorithm. These two algorithms shall be discussed in greater detail in the layout optimization algorithm sections below. Given the optimal layout, the material handling time may be updated. The material handling time may be estimated based on the rectilinear distance between the centroid of each department. These new parameters (i.e., material handling time) may then be implemented in the simulation model 102. The simulation model 102 may then evaluate the optimality of the result, if it is optimal, the framework 100 will report the result. If it is not optimal, the framework 100 will start again by allocating resources based on the latest layout design and this loop will continue until the optimal solution is achieved.

Simulation Modeling

Simulation models (e.g., the simulation model 102) may be implemented to study one specific part of the real world in more detail to achieve some outcomes or desired output. Simulation models can be categorized to different classes such as agent based or discrete event modeling. These categories are chosen based on the application under study. The present inventive concept may utilize discrete event simulation (DES), at least in the embodiment of optimization of a vegetable or plant propagation facility. DES models the behavior of the system as a series of consecutive events where no change occurs between any two consecutive events in the system. In other words, any change in the status of the system is an event. Due to the assumption of no changes between events, time can jump in the interval that no event is happening. As a result, the DES runs faster in comparison to real world clock. In other words, the simulation model 102 may utilize DES at least in the embodiment of optimization of a vegetable or plant propagation facility.

Figure 2:
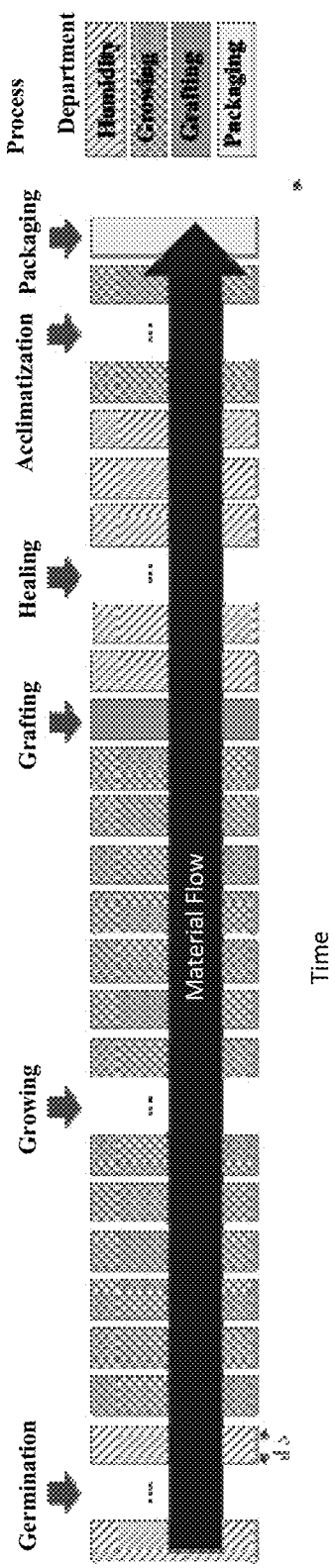
FIG. 2 is an illustration of material flow and processes of a system described herein.

To have a clearer understanding of the simulation model 102 described and utilized herein, a more specific system may be examined. As one example, the main goal of a vegetable propagation facility is to produce high quality grafted vegetable seedlings. To achieve this goal, plants need to go through multiple processes. FIG. 2 shows a typical flow of the materials in such plant propagation facilities. A plant propagation facility may include one or more departments (shown on the right side of FIG. 2) which may be assigned or associated with one or more resources, such as particular labor, equipment, or tasks.

As shown in FIG. 2, to have high quality grafted seedlings, scion and rootstock trays may be seeded and placed in a humidity site (i.e., 'humidity department') for a predetermined duration of time (days). Then the trays of germinated scion and rootstock seedlings are moved to a greenhouse to grow ('growing department'). When seedlings are ready to be grafted, scion and rootstock plants are cut at the same angles. Then, the rootstock seedlings are clipped together joining the end cuts of both scion and rootstock seedlings. Next, the grafted plants go to the humidity department with high humidity and low light so that both rootstock and scion can grow together as one plant. After the humidity department, grafted plants return to the growing department to go through the acclimatization process before shipping. The last department is where the plants are packaged and shipped to customers. In addition to the mentioned departments which are directly in contact with grafted seedlings, office and utility areas are also considered for the layout.

These production processes may be modelled using DES (in the form of the simulation model 102). Each process is handled with a specific set of resources. For example, healing chambers and greenhouse benches are the necessary resources for the humidity and growing departments, respectively. Grafting and packaging processes are simulated as completely manual processes, where the required resources are the grafting workers who handle all the related tasks and the packagers, respectively. Table 1 below describes each process and its entry and exit status (materials) (i.e., seeds and soil). Table 1 also describes the required resources for each process and task.

TABLE 1

Simulation model entity and resource description in each process

| Process | Task | Entity In | Entity Out | Resources |
| --- | --- | --- | --- | --- |
| Germination | Seeding | Seed | Scion/ Rootstock | Seeder, Seeding Vacuum, soil, tray |
|  | Germinating | Scion/Rootstock | Germinated Scion/ Rootstock | Healing chamber, soil, tray |
| Growing | Growing | Germinated Scion/ Rootstock | Grown Scion/ Rootstock | Greenhouse bench, soil, tray |
| Grafting | Scion Cutter | Grown Scion | Cut Scion | Scion Cutting, soil, tray |
|  | Rootstock Cutting | Grown Rootstock | Cut Rootstock | Rootstock Cutter, soil, tray |
|  |  | Cut Rootstock | Clipped Rootstock | Rootstock Clipper, soil, tray |
|  | Joining | Cut Scion/Clipped Rootstock | Grafted Plant | Joiner, soil, tray |

TABLE 1-continued

Simulation model entity and resource description in each process

| Process | Task | Entity In | Entity Out | Resources |
|---------|------|-----------|------------|-----------|
| Healing | Healing | Grafted Plant | Healed Plant | Healing chamber, soil, tray |
| Acclimatization | Acclimatizing | Healed Plant | Acclimatized Plant | Greenhouse bench, soil, tray |
| Packaging | Packaging | Acclimatized Plant | Shipped Plant | Packager, soil, tray |

A set of resources is used within each process to handle pre-assigned tasks. Given the flow of the material shown in FIG. 2, entities change within the simulation model 102 by going through different processes as described in Table 1. For example, the grown scion entity will be changed to the cutting scion entity by going through the scion cutting task and utilizing the appropriate resources (e.g., scion cutters) within the simulation model 102.

Another crucial step in utilizing DES is verification and validation. To verify the embedded logic and data, the behaviour of a single entity was studied in the model to make sure all the listed transformations in Table 1 are taking place. Then, a smaller scale DES model was developed and its results were compared with the ground truth which was provided by the facility under study. The ground truth was within a 95% confidence interval supporting the validity of the procedure.

Although there are many ways to design the logistics of the grafting process, a workflow of in-line/assembly line operation was examined. In an assembly line operation, each worker will have an assigned specific task such as cutting scion, cutting rootstock, joining two plants together, etc. All laborers work through a single 8-hour shift which has a 30-minute lunch break and two arbitrary 15 minutes breaks. To balance grafting related tasks, workers who handle scion cutting, rootstock cutting, and rootstock clipping duties start and leave their shifts 45 minutes before other workers.

Figure 3:
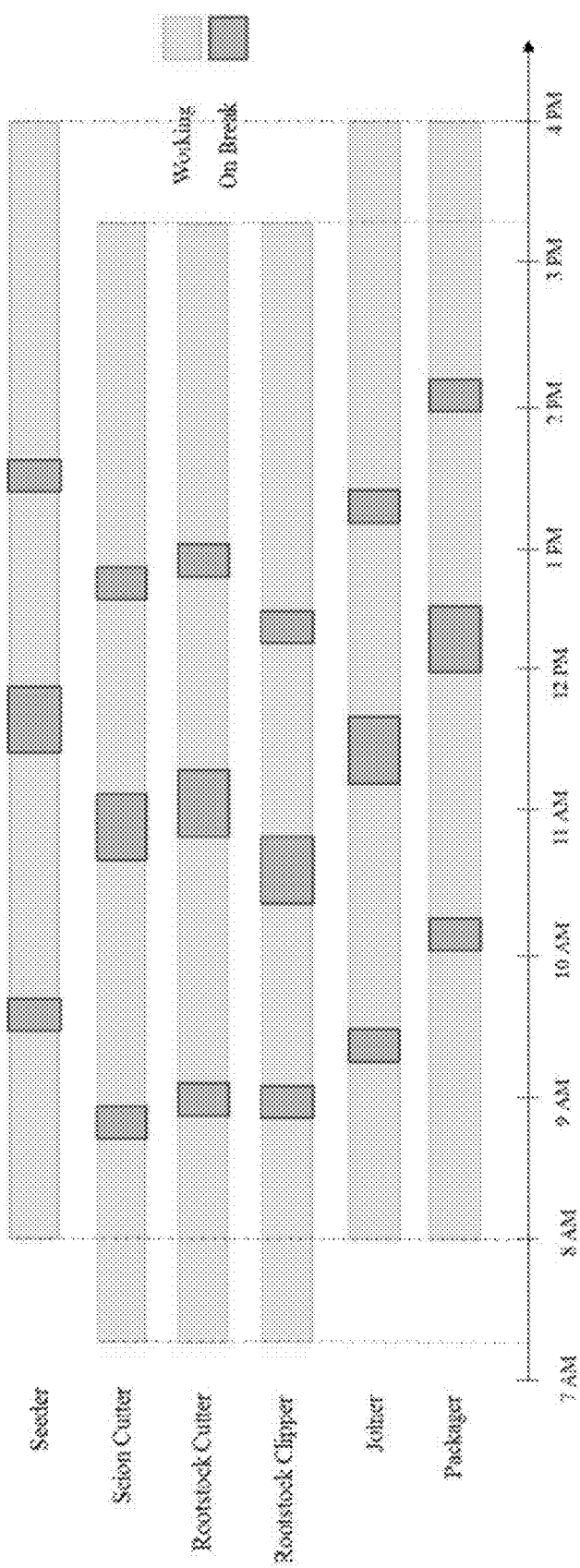
FIG. 3 illustrates a possible realization of working hours and breaks.

FIG. 3 shows a possible break schedule for workers in a facility, where scion cutters, rootstock cutters, and rootstock clippers start their shifts 45 minutes earlier. This shift in the work schedule provides a buffer for joiners and as a result, it minimises the idle time of joiners. Workers are allowed to have a break as soon as they complete all work in progress.

Figure 4:
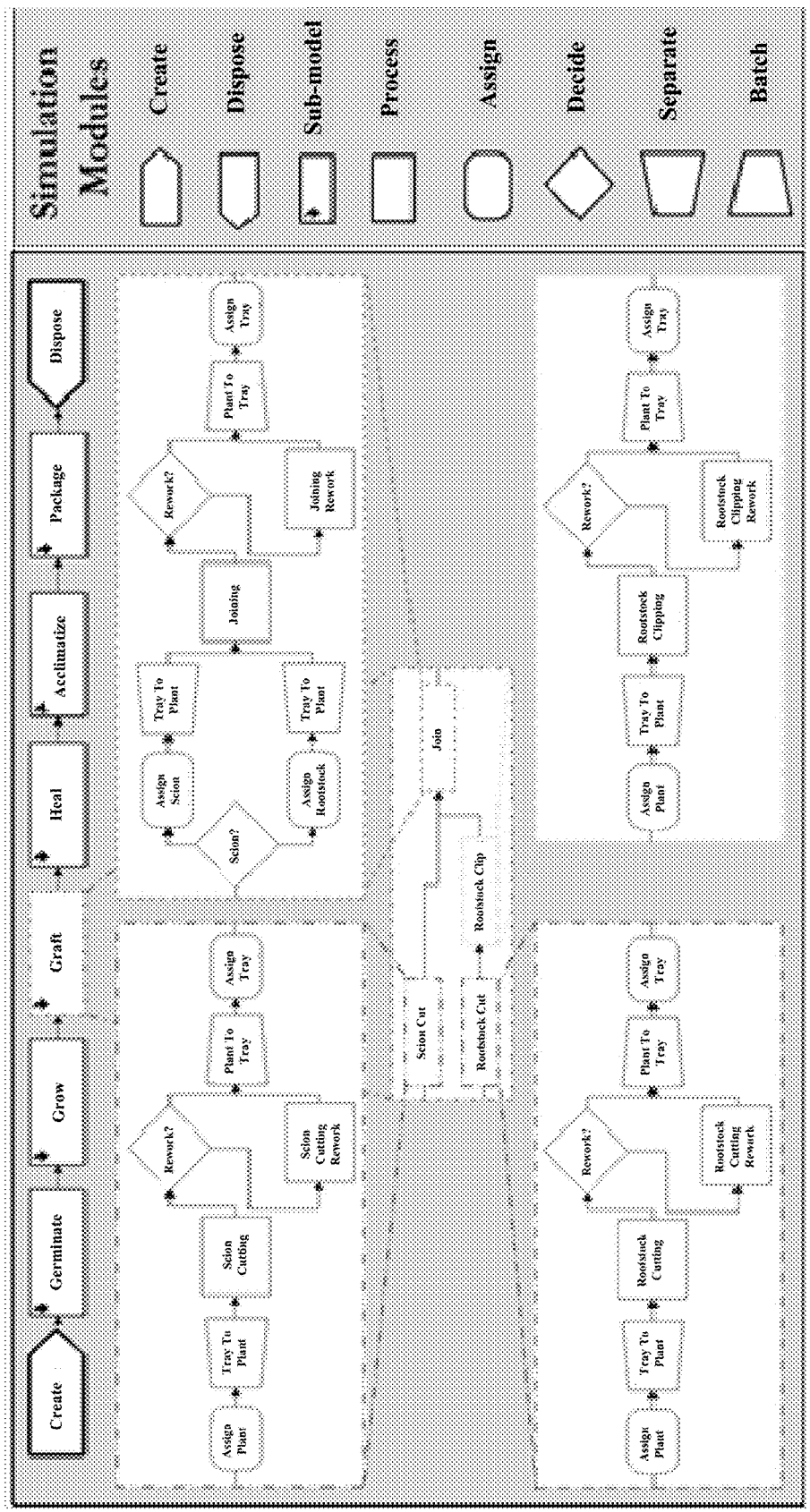
FIG. 4 illustrates logic of the developed DES model described herein.

FIG. 4 displays the logic within the simulation model 102 of the present inventive concept. The DES of the simulation model 102 may include seven processes and each process models a specific task. Given that the grafting department is generally the most crucial part for successful vegetable propagation, this process is enlarged within FIG. 4.

As noted, grafting involves the four tasks of scion cutting, rootstock cutting, rootstock clipping, and joining. All of these tasks are shown in detail in FIG. 4. Each task is handled by a number of workers assigned to the task. Although a single plant is the minimum unit for this logistic simulation, a worker will not move to another tray without completing the current tray. When each process is completed, a worker will pass his tray to the next person. But during each process, workers will pick plants one-by-one. That is why in each process such as scion cutting, we have used the separate module to replace a tray with an equivalent quantity of plants of the same tray. As a result, each worker can pick up the plant, finish his/her related tasks and put the plant back in the tray. When the whole tray is done, it moves to the next process. To model this part, the batch modules are utilized to group plants within a tray in the simulation model. In addition, workers need to inspect each plant to see if there is a deficiency in the product that needs to be addressed for each task. For example, joiners need to pick up a cut scion and a clipped rootstock, align the end cuts of the mentioned seedlings, and clip them together. When workers inspect the joined plants for any potential problems, they may need to rework the joining processes to solve any potential problems. Other segments have been modelled using a similar pattern. Table 1 displays the resources and entities entering and exiting each process and segment.

As mentioned in FIG. 1B, simulation needs to be implemented by the simulation model 102 verify if the suggested resource allocation can handle the production of a targeted, desired, or predetermined goal. In other words, simulation, as shown in FIG. 4, may be used for verification due to its ability to consider elements such as material handling and time management.

Optimization Modeling

An optimization model can generally be formulated anywhere decisions are made. The core of this process is formulating the problem by using variables and parameters to define the objectives and constraints. Table 2 below describes the nomenclature of variables and parameters.

TABLE 2

Nomenclature of variables and parameters

| Variable/parameter | Definition |
|---|---|
| bS | capacity of growing bench |
| BS | facility size |
| $G_i$ | daily production of grafted tray type i, i = 1, 2 |
| K | number of days in growing department |
| L | number of days in humidity department |
| $\lambda_j$ | space coefficient for worker to handle task j, j = 1, 2, 3, 4, 5, 6 |
| $\lambda_k$ | space coefficient for chamber/bench k, k = 1, 2 |
| M | percentage of available space |
| $mh_{ij}$ | average material handling time (min) of tray i at task j, i = 1, 2 j = 1, 2, 3, 4, 5, 6 |
| mS | capacity of healing chamber |
| OS | size of office |
| $pt_{ij}$ | average processing time (min) of tray i at task j, i = 1, 2 j = 1, 2, 3, 4, 5, 6 |
| $R_i$ | daily production of rootstock tray type i, i = 1, 2 |
| $S_i$ | daily production of scion tray type i, i = 1, 2 |
| $S_j$ | standard working space required for a worker to handle task i, j = 1, 2, 3, 4, 5, 6 |
| $S_k$ | standard space required for a chamber/bench k, k = 1, 2 |
| SS | size of shipping department |
| $tS_i$ | size of tray type i, i = 1, 2 |
| US | size of utility department |
| $X_{growing}$ | number of growing benches |
| $X_{healing}$ | number of healing chamber |
| XP | percentage of facility allocated space for headhouse |
| $y_j$ | number of workers assigned to task j, j = 1, 2, 3, 4, 5, 6 |

Part of formulating an optimization model is determining the resources and time available. Here, we maximize the production capacity of our facility under study where our objective (i.e., Equation (1)) is to maximize the daily production of finished products. Equation (2) defines the restriction of space. Given the total size of the facility, the summation of the assigned space for workers, tools, and the departments of shipping, utility, and office should be less than M % of the available space. The size of departments of shipping, utility, and office is decided based on response variables such as SS, US, and OS which are defined based on the production capacity of the facility. The assigned space for workers depends on their task and whether they are working with any robots such as seeder vacuums. Equations (3) and (4) balance the capacity of humidity and growing departments. Given the flow of material in the facility under study as shown in FIG. 2, each tray should spend K days in growing and L days in humidity departments, respectively. To achieve a daily production level that is balanced, we constrain daily production to only 1/Kth of the total capacity of growing department. Similarly, only 1/Lth of the total capacity of humidity department will be available for daily production. Equation (5) models the limitation of time. Total time for both processing and material handling tasks should be less than the total available hours in a work day. The decision variables (i.e., $x_{growing}$, $x_{healing}$, $y_j$) are defined via Equation (6) as positive integer values. $y_j$ is the number of workers who perform task j, including seeding, scion cutting, rootstock cutting, rootstock clipping, and packaging.

$$\text{Max} \sum_i G_i \quad (1)$$

Subject to:

$$\sum_j \lambda_j s_j * y_j + \sum_k \lambda_k s_k x_k + SS + US + OS \leq M * BS \quad (2)$$

$$\frac{bS * x_{growing}}{K} \geq \sum_i ((G_i + R_i + S_i) * tS_i) \quad (3)$$

$$\frac{mS * x_{healing}}{L} \geq \sum_i ((G_i + R_i + S_i) * tS_i) \quad (4)$$

$$\sum_{ij} ((pt_{ij} + mh_{ij}) * (G_i)) \leq 7 * 60 * \sum_j (y_j) \quad (5)$$

$$x_{growing}, x_{healing}, y_j \in Z^+ \quad \forall j \in \{1, 2, 3, 4, 5, 6\} \quad (6)$$

We make our results more realistic by considering restrictions on workers' availability and job sequencing through simulation. In this optimization model, $G_i$, $S_i$, $R_p$, $R_i$, SS, US, and OS are the response variables for i∈{1,2}. These are variables which values come from the simulation model as the evaluation result of optimization model. The feasibility of decision variables (i.e., $x_{growing}$, $x_{healing}$, $y_j$) are determined based on the value of response variables. In addition, by using simulation-based optimization, requirements such as workers' availability, job sequencing, and time management are no longer needed to be defined as constraints in the optimization model.

Layout Optimization Algorithms

Figure 5:
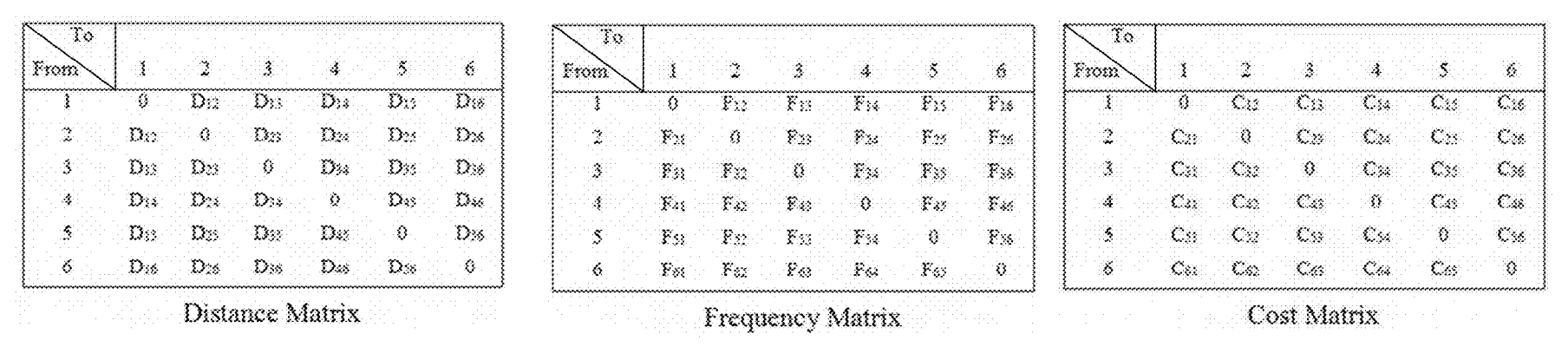

As mentioned above, layout design and resource allocation are interconnected problems. The optimal layout is the evaluation of several layout scenarios based on resource allocation to achieve one of many objectives such as reduction in material handling time, improvement of throughput, or minimization of space requirements. In this work, the main objective for layout design is to minimize the material handling time in a realistic design. The layout optimization process includes two main optimization algorithms 104 that may be managed or otherwise utilized by the simulation model 102. Theses algorithms are illustrated in the following sections. FIG. 5 displays the structure of the distance, frequency, and cost matrices that are utilized to find the optimum layout design.

Each element of the distance matrix $d_{ij}$ is defined as the rectilinear distance between the centroids of departments i and j for i,j=1, 2, 3, 4, 5, and 6. As long as the distance between two specific departments is calculated, no matter which one is the origin, the rectilinear distance between the centroids will be the same. This justifies the symmetricity of the distance matrix. The frequency matrix, which consists of $f_{ij}$s, shows the number of trips from department i to department j. In reality, it is not likely to have equal trips among i-j and j-i origin-destination pairs of departments. As a result, the frequency matrix is asymmetric. The cost matrix, whose elements are defined as $c_{ij}=f_{ij} \cdot d_{ij}$ for i,j=1, 2, 3, 4, 5, and 6 displays the commute cost within the facility. Equation (7) defines the main objective of layout redesign and layout improvement algorithms.

$$\text{Min } w_1 \sum_i \sum_j c_{ij} + w_2 \sum_i e_i \quad \forall i, j \in \{1, 2, 3, 4, 5, 6\} \quad (7)$$

As described in Equation 7, our main objective is to minimize total cost for an optimal layout design. This cost consists of two main parts which are the material handling time and design impact. The total material handling time is a summation over all the commutation between the different departments considering the frequency $f_{ij}$ and the distance $d_{ij}$ of each origin-destination pair. The design impact is defined based on the number of corners for each department (i.e., $e_i$) to define a realistic design. The effect of these two parts is normalized by utilizing the weights $w_1$ and $w_2$.

One of the main inputs for these two algorithms is the number of departments. As mentioned in Equation 7, a total of six departments are considered in this work. These departments include: 1) a growing department which handles both growing and acclimatization processes, 2) the humidity department which manages the seeding, germination, and healing processes, 3) a grafting department where the grafting process includes scion cutting, rootstock cutting, rootstock clipping, and joining tasks, 4) a shipping department which handles the packaging, shipping and inventory, 5) the utilities department, and 6) the office.

Layout Redesign Algorithm

Figure 6:
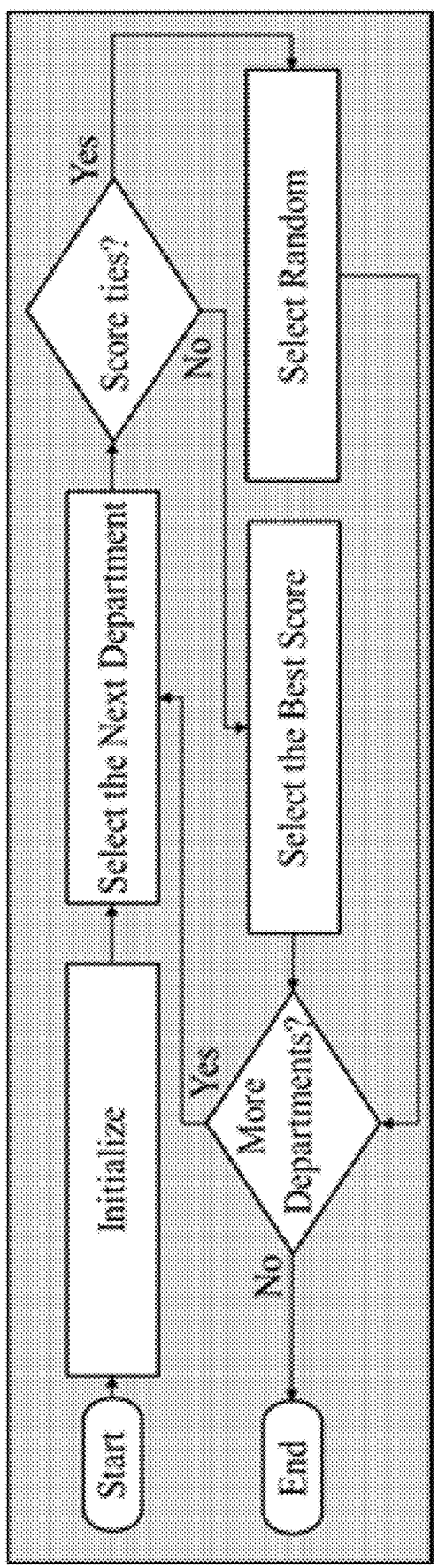
FIG. 6 is a flow diagram illustrating a layout redesign algorithm.

A layout redesign algorithm is designed to dynamically define a feasible layout design to develop the targeted daily production plan provided by simulation and optimization models by minimizing material handling time (i.e., $w_1=1$ and $w_2=0$). The flow diagram of the mentioned algorithm is displayed in FIG. 6.

This algorithm starts by reading the facility size, topology, number of departments, and their related parameters such as size of the departments. In Initialization, based on the given parameters from simulation and optimization models, the size of each department is estimated. This estimation is decided based on the amount of resources assigned to each department. In the next step (i.e., "Select the Next Department"), the first department is selected. Generally, this selection can be random. Here, the first department is shipping and packaging due to the fixed location of the loading/unloading door of such facilities. After choosing the first department, the algorithm selects the next department. The main condition for choosing the adjacent departments is their commutation score (i.e., $f_{ig}$) (i.e., "Select the Best Department"). The second department is the one who has the highest exchange with the first department. In other words, for any department i, the adjacent department is the one which has the highest $f_{ij}$ among the neighbouring departments js, where neighbourhood is defined as having common walls. In case of a tie where more than one department has the highest commute score (i.e., $f_{ij}$), a random selection can break the tie (i.e., "Select Random"). This loop continues until all departments are selected. After ranking all the departments, the algorithm starts to locate all the departments into the map based on the size, defined ranking and desired width. Although this algorithm considers minimizing the material handling cost $$\left(\text{i.e., Min} \sum_i \sum_j c_{ij}\right)$$

is an objective while designing the layout, the main goal of this algorithm is to find a feasible layout design that can meet daily production goals even though it does not guarantee optimality of the provided design. In addition, it is important to consider that such algorithms usually include weight of units being transported together with frequency. In this case, since the proposed algorithms are implemented within the simulation-based optimization framework where the simulation model controls the tradeoff between different transported units, all the transfer units have similar weights and the concept of weights does not need to be incorporated within this algorithm because it is already imbedded within the problem.

Layout Improvement Algorithm

Figure 7A:
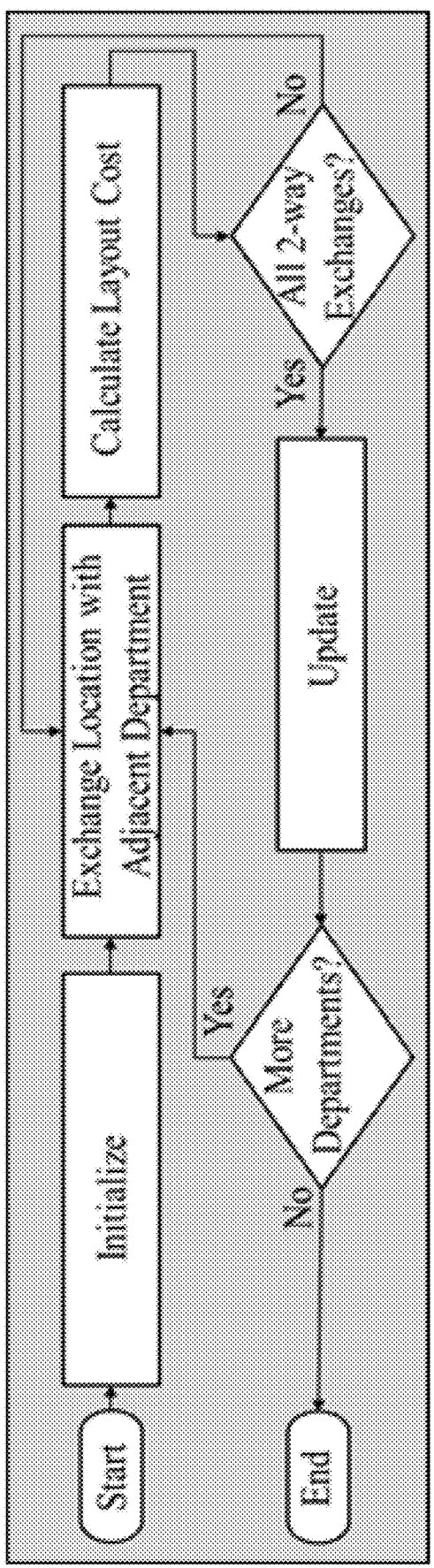
FIG. 7A is a flow diagram illustrating a layout improvement algorithm.

A layout improvement algorithm is designed to find the optimal layout for a given facility with known resources. This algorithm, as shown in FIG. 7A, searches among all the possible layout designs in order to find the best option.

The starting point for this algorithm is the result of the layout redesign algorithm. Given the feasible layout provided by the layout redesign algorithm, this algorithm initializes, as shown in FIG. 7A, by defining the departments' centroids in the current layout and calculates the initial cost $$\left(\text{i.e., } w_1 \sum_i \sum_j c_{ij} + w_2 \sum_i e_i\right)$$

and by considering the rectilinear distance between the departments (i.e., $d_{ij}$), the commute score (i.e., $f_{ij}$), and the quantity of corners in each department (i.e., $e_i$). Then, the algorithm selects a feasible department (i.e., a department whose location is not fixed) and exchanges its location with its adjacent departments. In each exchange, the algorithm determines the new centroids, updates the rectilinear distance (i.e., $d_{ij}$) and $e_i$ for the departments that have been affected by this change, and calculates the layout cost by utilizing Equation (7). The commute scores (i.e., $f_{ij}$) are fixed through this algorithm due to the fact that the production capacity is considered to be fixed. This algorithm minimizes the material handling cost via finding the optimum size, topology and location of each department. After counting all the one by one exchanges for a specific department and its adjacent departments, the algorithm updates the current best layout. These steps continue until all the possible combinations are checked. As a result, the optimal layout design is achieved by counting all the possible combinations of department locations and shape, and the resulting layout minimizes the total cost $$\left(\text{i.e., Min } w_1 \sum_i \sum_j c_{ij} + w_2 \sum_i e_i\right)$$

for that specific resource allocation. $w_1$ and $w_2$ have major roles in this algorithm because without them, $$\sum_i \sum_j c_{ij}$$

can easily overshadow the impact of $$\sum_i e_i.$$

To avoid this problem, considering the processing time data provided in Table 3 and conducting multiple experiments, upper bands have been defined for $$\sum_i e_i$$

as well as $$\sum_i \sum_j c_{ij}.$$

Utilizing these upper bands, the values 0.05 and 0.95 have been assigned to $w_1$ and $w_2$, respectively.

Figure 7B:
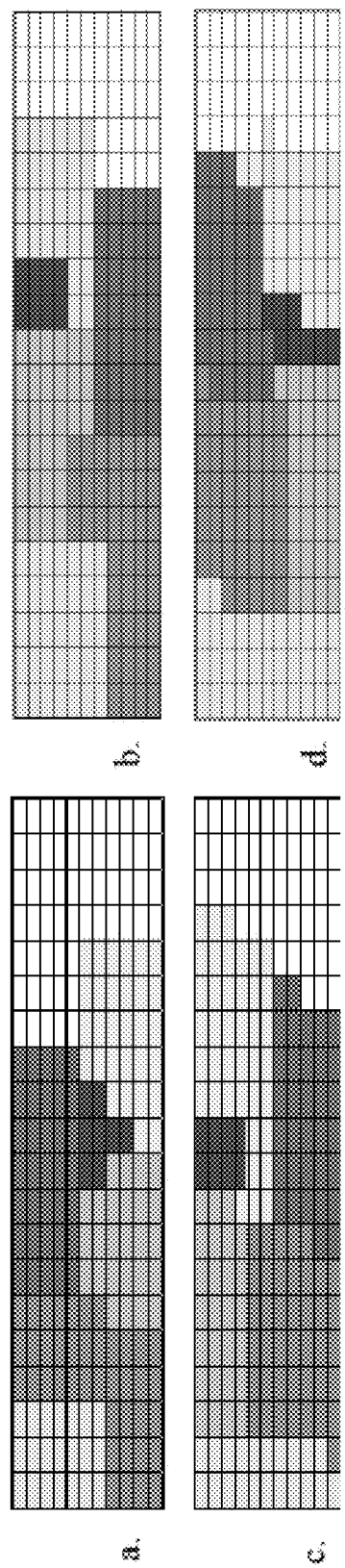
FIG. 7B is a simplified block diagram illustrating different possible topologies of departments for a facility where the departments may be exchanged or change positions as described to identify a topology that minimizes cost.

Based on the results of this algorithm (i.e., the size of the departments, and the topology of the layout design), the original simulation model is updated. Then, the simulation model determines whether the combination of resource allocation and layout design is optimal. FIG. 7B illustrates different color-coded blocks which may be associated with different facilities of a department. As shown, based on how the departments are mapped along a facility, the topology of the departments of a facility may be visually different. These departments shown may be re-positioned or exchanged as described to identify the optimal layout redesign 108.

Experiment and Results

A major problem in developing a vegetable seedling propagation facility is that no industry standard layout guidelines or specific instructions are available. The closest available option is a general guideline for building of greenhouses, recommending the optimal proportion of headhouse and greenhouse for a standard greenhouse design. Vegetable grafting nurseries are in need of more headhouse space due to the need of a grafting department as well as additional facilities such as healing systems, yet those who design and build the facility have to rely on their guesswork. Notably, the present inventive framework can generate different optimal layout designs and resource allocations based on different configurations and inputs. In other words, this customizable framework can define a specific and tailored solution for any facility through validating the simulation model based on the given facility's parameters and running the optimization modules upon the validated models. Below, a series of experiments are described which were conducted to study the difference in production capacity and costs between a facility built per existing greenhouse guidelines and that designed optimally using our framework to maximize the production capacity. After attaining the optimal space allocation for the headhouse and greenhouse, the optimum design is illustrated, and sensitivity analysis is conducted to study these solutions in further details.

The main assumption here is having a property, where both headhouse and greenhouses will be built. Here, a set of experiments are designed to find the optimal percentage of space assigned to headhouse and greenhouses. Table 3 below displays the input data and assumptions considered for conducting the experiments. These data include the worker's processing time of each task given the tray type (two types are considered), the dimensional characteristics of the resources, objects and the facility, and the duration of propagation stages.

TABLE 3

Input data and assumptions for the framework

| | | | Mean worker time (min/tray/person) | Standard deviation (min/tray) |
|---|---|---|---|---|
| Processing time | Tray 1 (rockwool) | Seeding | 2.00 | 0.50 |
| | | Rootstock Cutting | 8.56 | 1.26 |
| | | Rootstock Clipping | 12.89 | 2.88 |
| | | Scion Cutting | 8.22 | 2.14 |
| | | Joining | 43.39 | 6.23 |
| | | Packaging | 7.04 | 0.05 |
| | Tray 2 (peat moss) | Seeding | 2.00 | 0.45 |
| | | Rootstock Cutting | 8.04 | 1.20 |
| | | Rootstock Clipping | 12.12 | 2.12 |
| | | Scion Cutting | 7.72 | 2.18 |
| | | Joining | 40.32 | 5.96 |
| | | Packaging | 7.04 | 0.05 |

| | | Width (meter) | Length (meter) | Size (square meter) |
|---|---|---|---|---|
| Dimension | Seeder | 1.50 | 2.00 | 3.00 |
| | Rootstock Cutter | 1.00 | 2.00 | 2.00 |
| | Rootstock Clipper | 1.00 | 2.00 | 2.00 |
| | Scion Cutter | 1.00 | 2.00 | 2.00 |
| | Joiner | 1.00 | 2.00 | 2.00 |
| | Packager | 1.00 | 1.50 | 1.50 |
| | Healing chamber | 2 | 2.50 | 3.75 |
| | Growing Bench | 1.52 | 3.96 | 6.02 |
| | Tray 1 (rockwool) | 0.45 | 0.60 | 0.27 |

TABLE 3-continued

Input data and assumptions for the framework

| | | | | |
|---|---|---|---|---|
| Tray 2 (peat moss) | | 0.30 | 0.55 | 0.17 |
| Lot | | 34 | 40 | 1360 |

| | | Mean duration (days) | Standard deviation (days) |
|---|---|---|---|
| Propagation Stage Duration | Germination | 3 | 0.3 |
| | Growing | 16 | 1 |
| | Healing | 7 | 0.5 |
| | Acclimatization | 4 | 0.4 |

In Table 3, the processing time of workers corresponding to different tasks and tray types are based on previous studies conducted for a vegetable grafting facility. Number of plants per tray for rockwool and peat moss is 268, and 252 plants, respectively. Due to the greater number of plants per tray, rockwool requires a longer processing time. For each worker, a standard personal work space, as shown in the dimension section of Table 3, is defined based on worker's duty and tools. These defined spaces can fully cover the related requirements of workers' tasks. These defined spaces are the same as the standard working space required for a worker to handle task j (i.e., $s_j$, j=1, 2, 3, 4, 5, 6) in Equation (2). Similarly, the sizes of trays and healing chambers and growing benches (i.e., $s_k$, k=1, 2), and the facility (i.e., BS in optimization model) are also defined here as constants. As shown in FIG. 2, germination and healing take place in the humidity site, while growing and acclimation are managed in the growing department (i.e., greenhouses). As a result, the number of days in the growing department (i.e., k) in Equation (3) is 20, and the number of days in the humidity site (i.e., L) in Equation (4) is 10. The data provided in this section are inputs for our simulation model as well.

In order to study the impact of headhouse space allocation on the daily production capacity, we varied the proportion of headhouse space which includes grafting, humidity, shipping, utilities, and office departments. The total available space for the headhouse was restricted to a selected percentage of the total facility size (headhouse and greenhouse). The percentages examined are from 15% up to 80% with an increment of 1% points. For each percentage of headhouse space, the maximum daily production capacity is found by utilizing our simulation-based optimization framework. The optimal result of each experimental condition is defined based on 100 replications to consider the impact of uncertainties such as workers' performance modelled within the simulation model.

Results and Discussion

Figure 8:
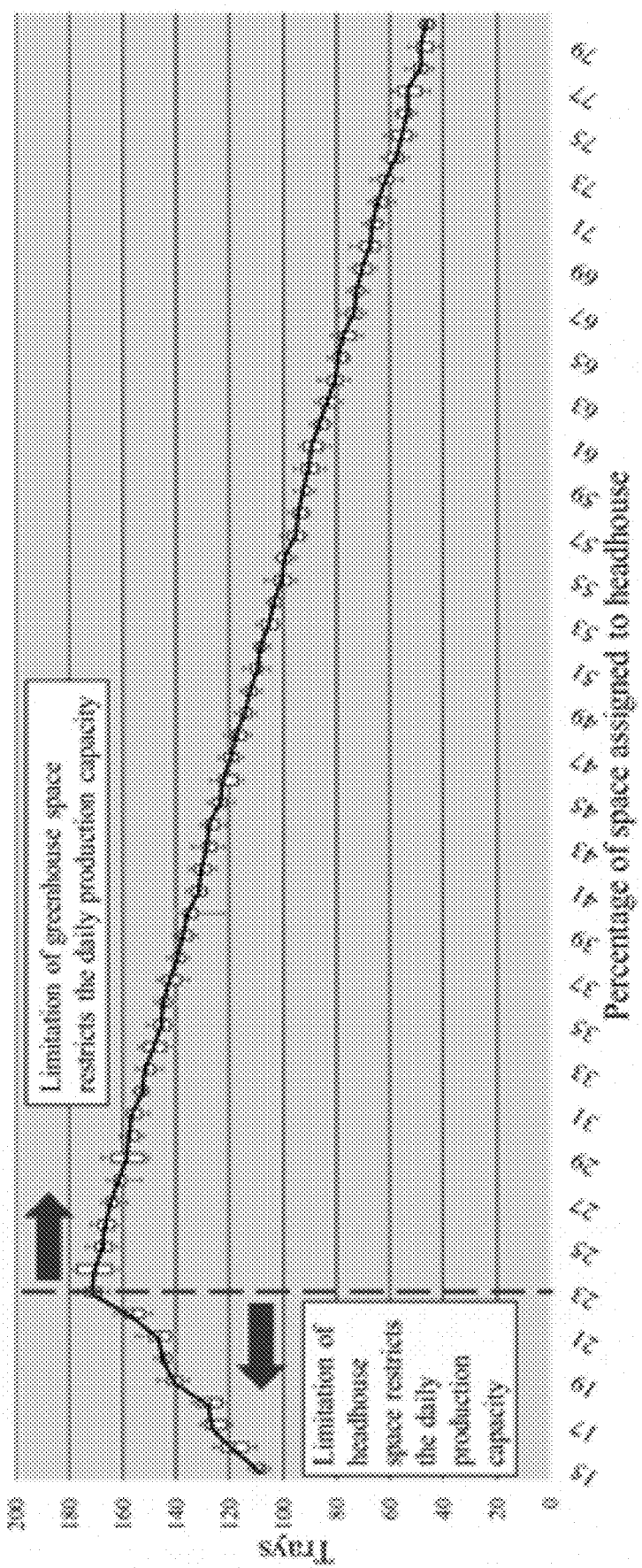
FIG. 8 is a graph showing the daily production capacity given the restriction of headhouse space.

The effect of different percentage levels of headhouse space over the total facility space (1360 m²) on daily production capacity is shown in FIG. 8. As shown, the maximum production capacity (i.e., 171 trays per day) is achieved by allocating 23% of the space (i.e., 312.8 m²) to the headhouse. As a result, the remaining 77% (i.e., 1,047.2 m²) will be assigned to the greenhouse area. This certain allocation of space, which can balance the production capacity between the greenhouse and headhouse, can lead to a 34.67% increase in daily production capacity on average compared with optimal resource and layout design for other headhouse space allocations (i.e., 15% to 80% headhouse space allocation). While assigning less than 23% space to the headhouse mainly limits the required space for the grafting workers and reduces the daily production capacity, assigning more than 23% restricts the available number of growing benches, which leads to a reduction in daily production capacity. To have a better understanding of the potential savings as a result of utilizing our proposed framework, Equations (8) to (12) have been utilized to define the structure of the variable cost and its components for this study.

$$V_{cost} = V_{amortized} + V_{labor} + V_{utility} \tag{8}$$

$$V_{amortized} = V_{amChamber} + V_{amRobot} \tag{9}$$

$$V_{amChamber} = V_{amGrowing} + V_{amGrafting} + V_{amHealing} + V_{amPackaging} \tag{10}$$

$$V_{labor} = V_{labSeeding} + V_{labGrafting} + V_{labPackaging} \tag{11}$$

$$V_{utility} + V_{utGrowing} + V_{utGrafting} + V_{utHealing} + V_{utPackaging} \tag{12}$$

Figure 9:
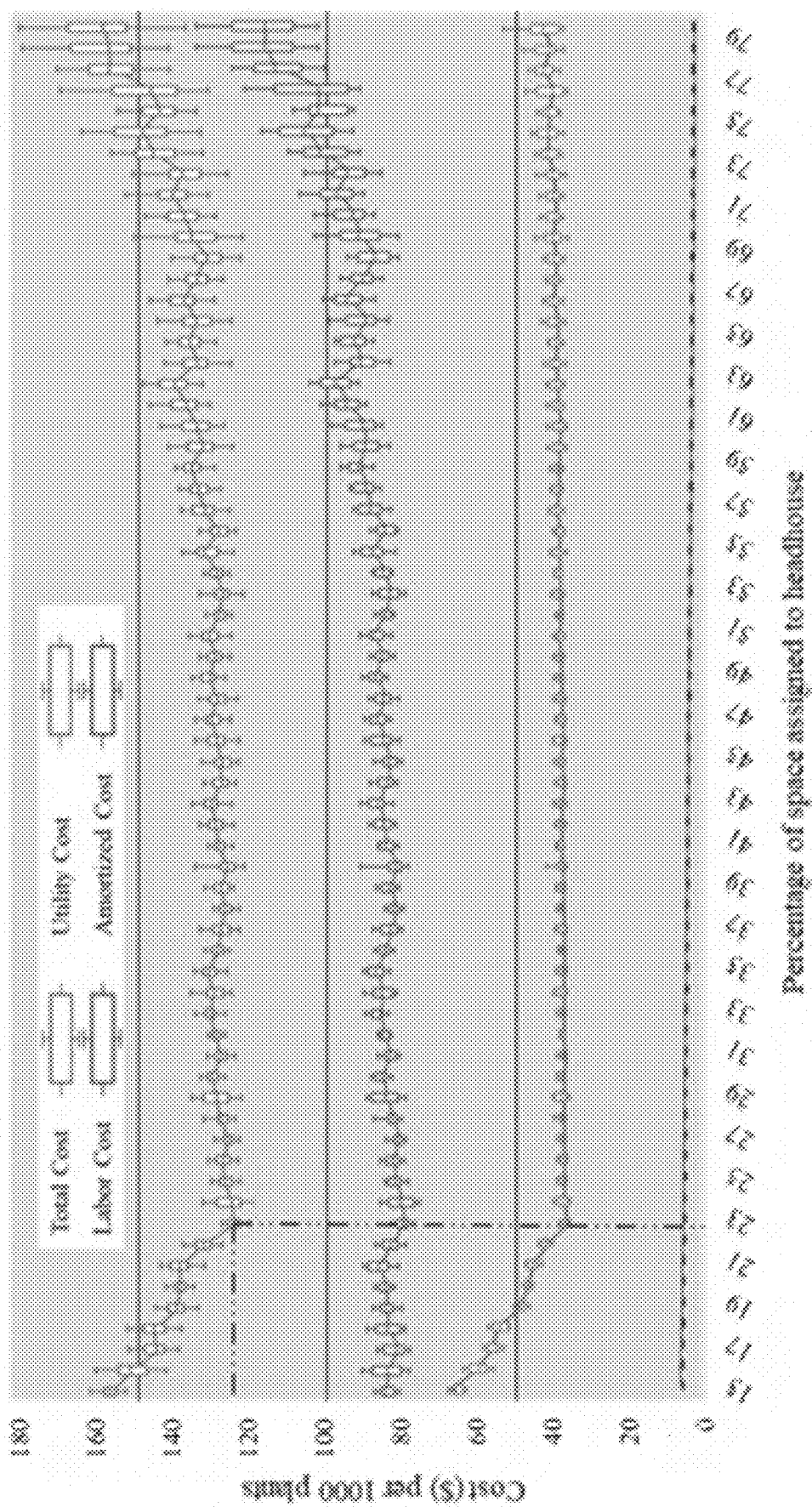
FIG. 9 is a graph showing the amount of labor, utility, amortized, and total cost per 1000 plants over different headhouse space allocations.

Given the fact that this work focuses on optimizing the resource allocation and layout design, components such as utility cost (i.e., $V_{utility}$ as defined in Equation (12)), labor cost (i.e., $V_{labor}$ as defined in Equation (11)), and amortized cost (i.e., $V_{amortized}$ as defined in Equation (9)) have been included in the variable cost (i.e., $V_{cost}$) as shown in Equation (8). Equation (9) amortizes costs of chambers (i.e., $V_{amChamber}$ as defined in Equation 11), and robots (i.e., $V_{amRobot}$) such as seeder vacuum. Equation (10) describes this cost as the summation of amortized greenhouse (i.e., $V_{amGrowing}$), grafting (i.e., $V_{amGrafting}$), healing (i.e., $V_{amHealing}$), and packaging (i.e., $V_{amPackaging}$) departments. In addition, the following assumptions were taken into consideration: a construction cost of $1000 per square meter for humidity and growing departments, a construction cost of $650 per square meter for the remaining departments, useful lives of 30, 20, 40, and 40 years for the departments of humidity, growing, grafting, and packaging, seeder vacuum with a price of $400 and useful life of 7 years, an hourly wage of $12.5 for workers, power consumption rates of 0.5059, 1.6764, 0.0290, and 0.0290 kWh per square meter for the growing, grafting, humidity, and packaging departments, respectively, and an electricity rate of $0.065 per kW. FIG. 9 displays the total cost and its component as defined through Equations (8) to (12), for all the under study values of assigned space to headhouse per 1000 plants.

FIG. 9 depicts how the allocation of space to headhouse affects the cost of grafted plants. As shown in FIG. 9, the amortized capital cost is reduced by increasing the percentage of headhouse space because greenhouses have a higher amortized capital cost in comparison to headhouse for a square meter due to the fact that more resources such as benches are utilized within the greenhouses. As a result, the greenhouse space is reduced by increasing the headhouse allocated space, which leads to a deduction in amortized cost. The utility cost has a minimum value of $0.037 per plant at 23% headhouse space allocation due to the fact that the cost of controlling the environment of the facility is broken down to the overall maximum production capacity. The labor cost fluctuates over the different allocations of headhouse space due to the diverse distributions of workers (i.e., assigning different quantity of workers to different tasks) for maximizing the production capacity with respect to the restriction of space within greenhouse and headhouse areas. Although there are fluctuations over the total price, the global minimum (i.e., $0.080 per plant) happens with 23% of the space allocated to the headhouse. As shown in Equation (8), the summation of amortized, labor, and utility costs define the total cost which has a minimum value of $0.123 per plant at 23% space allocation to headhouse. Here, detailed design elements such as area and location of departments and the required number of resources within each department for achieving the optimal production capacity are discussed. Table 4 displays the optimum layout design and resource allocations within the facility considering the optimal space allocation (i.e., 23% of total space or 312.8 m² headhouse and 1,047.2 m² greenhouses) as shown in FIG. 9.

TABLE 4

The optimal layout design and resource allocation provided by our proposed framework

| Department Name | Size (m²) | Width (m) | Length (m) | Task Name | # Units/ Workers | Production Capacity (Tray per day) |
|---|---|---|---|---|---|---|
| Growing | 946.9 | 36.56 | 25.9 | Growing Bench | 128 units | 171 |
| Humidity | 94.6 | 4.3 | 22 | Healing Chamber | 8 units | |
| | | | | Seeder | 2 units | |
| | | | | Vacuum Seeder | 2 units | |
| Grafting | 98.42 | 3.7 | 26.6 | Rootstock Cutter | 4 workers | |
| | | | | Rootstock Clipper | 5 workers | |
| | | | | Scion Cutter | 3 workers | |
| | | | | Joiner | 18 workers | |
| Shipping | 45 | 6 | 7.5 | Packager | 4 workers | |
| Utilities | 19.78 | 4.3 | 4.6 | NA | | |
| Office | 57.35 | 7.4 | 7.75 | NA | | |

Table 4 also displays the quantity of required resources (equipment and workers) for each task. As mentioned before, there is a positive correlation between the size of each department and the number of resources required that are assigned to that department. For instance, as for the grafting department results in our proposed framework, considering the 30 active workers and their work space requirement as described in Table 3, 98.42 m² (i.e., 30×2×

Figure 10:
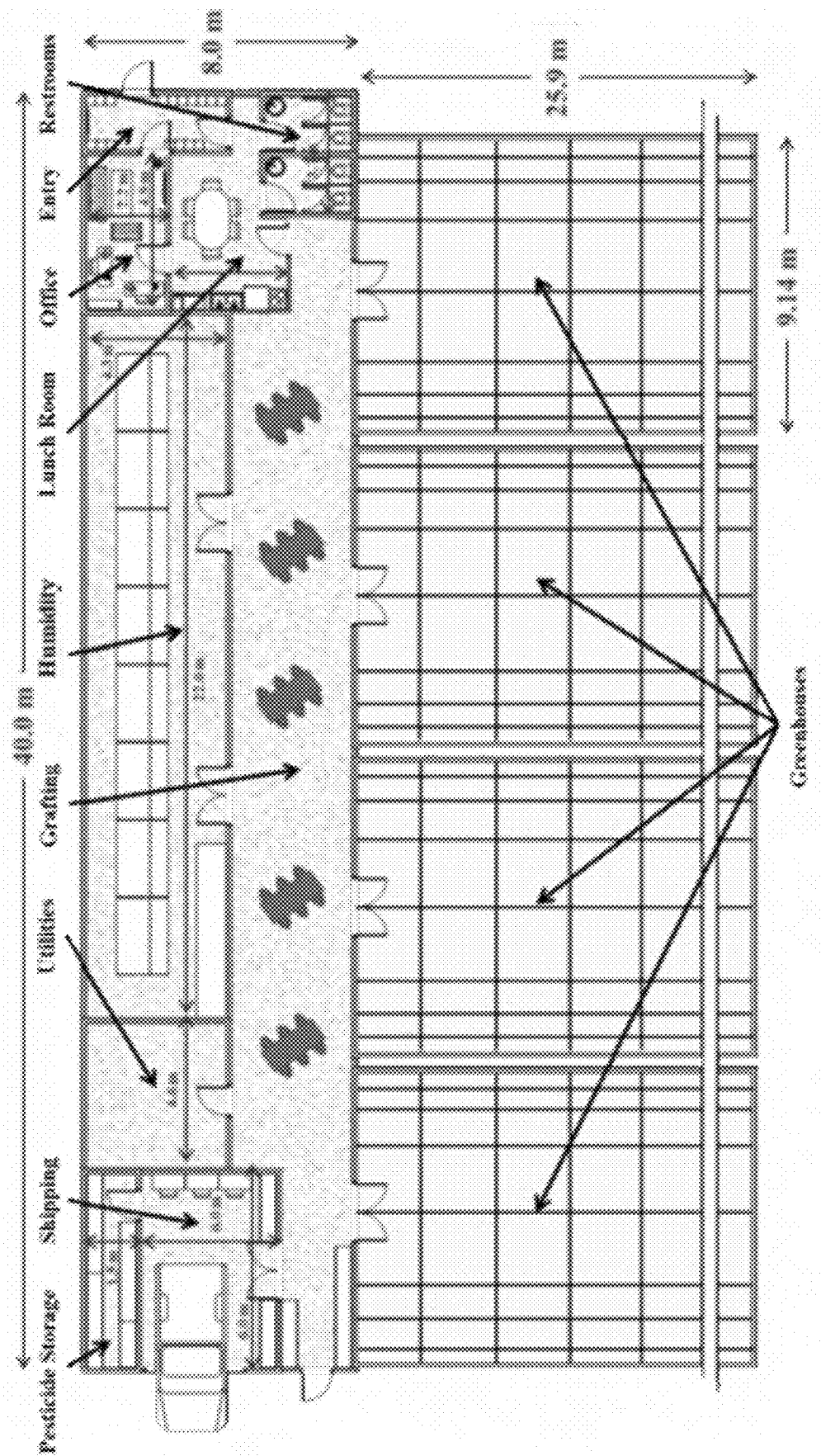
FIG. 10 illustrates an optimal or optimum layout design.

1.6) is the necessary space for the workers, where 1.6 is the coefficient (i.e., pre-defined parameter $\lambda_j$) considered as the required communication space. This communication space is mandatory because managers need to be able to walk through the tables without distracting the workers. As shown in Table 4, our proposed framework leads to a production capacity of 171 trays per day on average. This improvement is a result of a well-balanced production line, where all resources such as labor, healing chambers, growing benches, robots, and space are fully utilized. FIG. 10 shows the optimized layout developed by the proposed framework for a vegetable grafting nursery.

Figure 11:
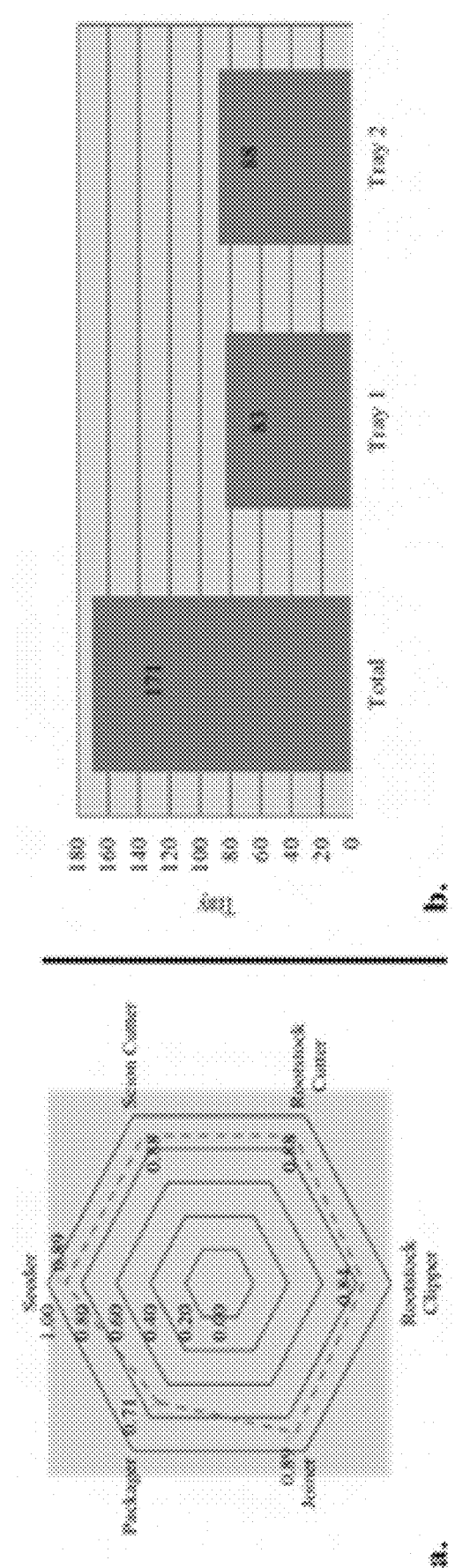
FIG. 11 illustrates resource utilization rate (a) and daily production capacity (b) reported by the DES model.

In total, 36 workers, 2 seeding vacuums, 128 greenhouse benches, and 8 healing chambers are required to achieve the maximum daily production capacity of 171 trays per day. As shown in FIG. 10, the greenhouse area is divided to four sub units each of 9.14 m by 25.9 m in order to limit the spread of diseases as a protective measurement. By incorporating the optimal designed layout and allocated resources, the production capacity and workers utilization rate were reported by our developed simulation model as shown in FIG. 11.

The daily production of 171 trays consists of 83 (i.e., 83±3) type 1 trays and 88 (i.e., 88±5) type 2 trays. Given the results provided in Table 4, an important factor to measure the effectiveness of our framework is the utilization rate of the labor as shown in FIG. 11. An average utilization rate of 86% is achieved by having utilization rates of 89%, 88%, 88%, 84%, 89%, and 71% for seeders, scion cutters, rootstock cutters, rootstock clippers, joiners, and packagers, respectively. The optimality of the solutions suggested by this framework leads to effective utilization of space and resources which as a result reduces the variable cost of grafting by $0.032 per plant (i.e., 21.15%) in comparison to the recommended 15% of allocation of space to headhouse.

Sensitivity Analysis

As mentioned in the previous section, a production capacity of 171 trays per day can be achieved by implementing the optimal resource allocation and layout design. To study the impact of resource allocation on the price per plant, a set of experiments were conducted. For each experiment, the simulation model ran 100 replications to study whether any increase or decrease of the allocated resources can improve the production capacity as shown in FIG. 12.

Figure 12:
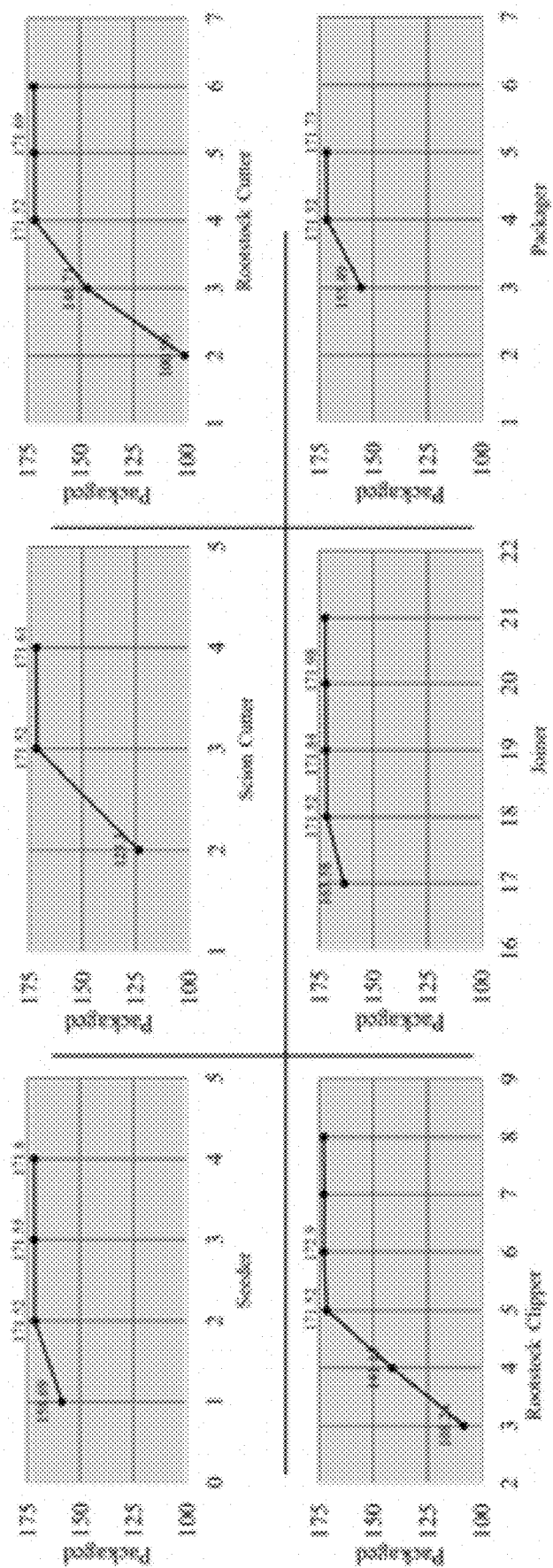
FIG. 12 depicts various graphs showing a sensitivity analysis on labor allocation for different tasks.

FIG. 12 displays the production capacity around the optimal resource allocation. While no increase in allocated resources leads to additional production, any decrease in assigned labor reduces the daily production capacity of 171 trays. This is due to the fact that the framework has successfully balanced the production line. Among these cases, the top five scenarios varied by different resource allocations around the optimal solution were selected in order to study the effectiveness of the framework in terms of cost analysis alongside the optimal resource allocation. These five chosen scenarios are shown in FIG. 13.

Figure 13:
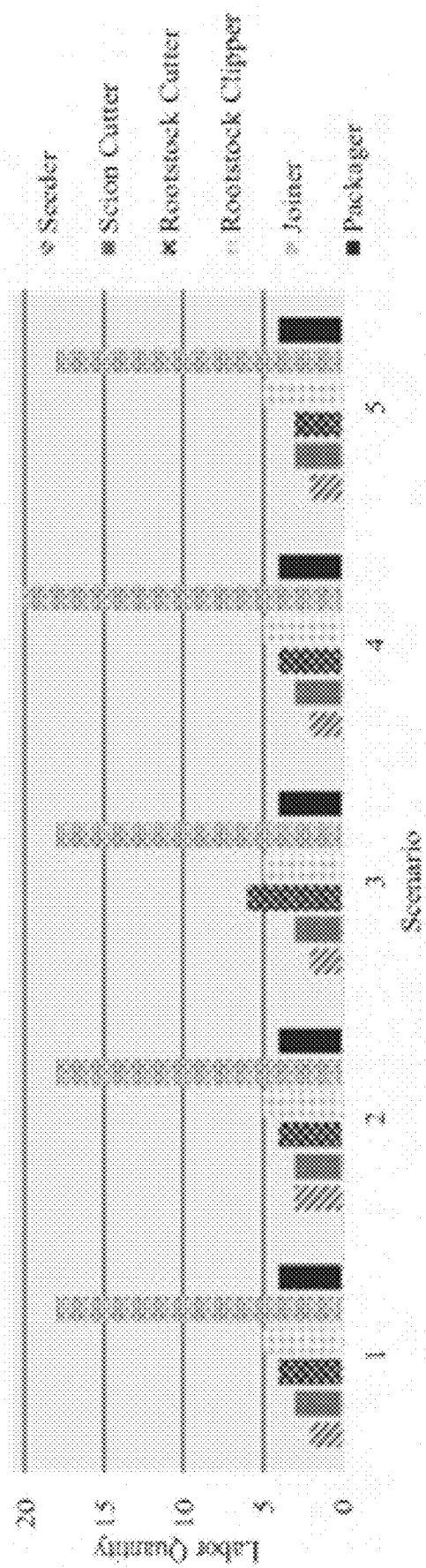
FIG. 13 depicts various bar graphs showing workers needed by departments for the top five scenarios described herein.

Among the 5 scenarios shown in FIG. 13, scenario 1 is the simultaneous optimal layout and resource allocation suggested by our proposed framework with a total of 36 workers. As further shown, scenarios 2, 3, 4, and 5 have a total of 37, 38, 38, and 35 workers distributed among different tasks, respectively. Following Equations (8) to (12), FIG. 14 displays the calculated variable costs for the introduced scenarios. These values are defined based on the statistics provided by the 100 replications of simulation run.

Figure 14:
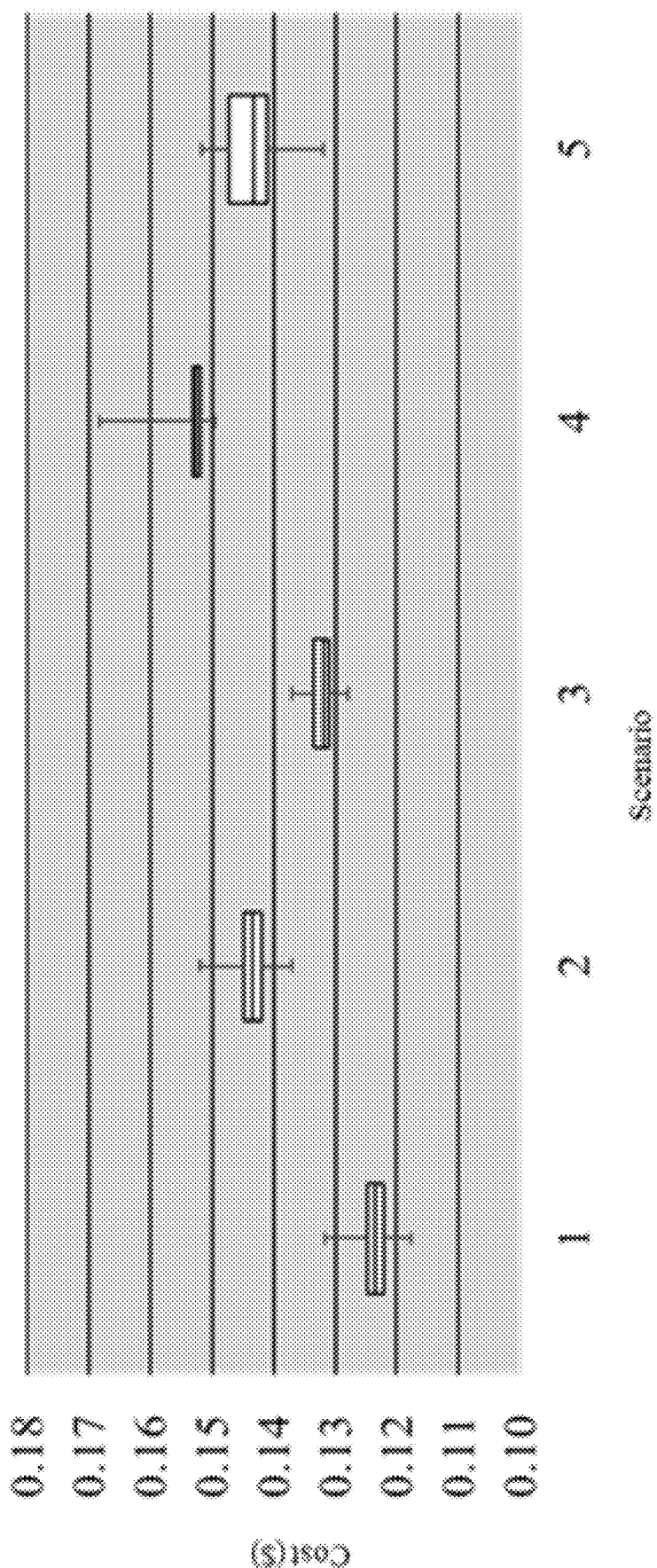
FIG. 14 illustrates the variable cost per plant for different resource allocations and layout designs scenarios.

As displayed in FIG. 14, the first scenario has the lowest variable cost per plant of $0.123, which is achieved by implementing the optimal layout design and resource allocation suggested by our proposed framework. In other words, by maximizing the utilization of the workers, we successfully reduced labor costs. It has been reported that labor can make up to 42% of the total cost of grafting in the USA. As a result, this reduction in labor cost has led to a decrease in the optimum variable cost. Scenarios 2, 3, 4, and 5 have variable costs of $0.142, $0.131, $0.152, and $0.143 per plant, respectively. In addition, the optimum layout design has led to a better utilization of space which in return not only has reduced the material handling time and improved the workers' utilization, but also has reduced the utility cost per plant. Similarly, the amortized cost and material cost per plants have been reduced due to the maximization of the production capacity of the under study facility.

CONCLUSION

In sum, the present document describes an inventive customizable framework 100 which, when applied to vegetable propagation, can accommodate any vegetable seedling propagation facility to submit its unique configuration (to the computing device 101 or other device executing the framework 100) and find the optimum layout design and resource allocation for the provided data leveraging the layout redesign and layout improvement algorithms devised. Not only was the proposed framework 100 capable of finding the optimum resource allocation to balance the production line and improve daily production capacity by 34.67% for the understudy facility, but it also provided the optimum layout design. Utilizing the simulation model 102, we learned that previous guidelines for designing a greenhouse will most likely not optimize production capacity. A potential saving of $0.032 (i.e., $0.155−$0.123) or 20.64% (i.e., $0.032/$0.155) can be achieved in terms of cost per plant, by implementing the optimal solution of the proposed framework 100 instead of assigning 15% of greenhouse space to the headhouse, as indicated in a past guideline (Aldrich and Bartok, 1994). This can lead to a potential labor, utility and amortized costs saving of 20.64% or $1,421.44 per day (i.e., 83 tray/day×268 plant/tray×0.032 $/plant+88 tray/day×252 plant/tray×0.032 $/plant).

In some embodiments, the framework may be applied to manufacturing and assembly facilities, supply chains, assembly shops, healthcare facilities, energy facilities, and the like. For example, an automotive manufacturing facility or factory may involve different types of workers working in different departments to build an automobile, and may also involve a blend of human and robot work departments. The functionality described herein may be leveraged to optimize resource allocation associated with the workers, and to also optimize the layout of the facility.

In other words, despite the majority of the aforementioned description being directed to plant propagation, any type of facility that provides an output, such as a general manufacturing facility, relies upon a well-designed layout, and the framework described herein may be leveraged to optimize the layout design of the general manufacturing facility, by addressing FDPs inherent to layout design and resource allocation as an integrated problem: estimating each department's size based upon resource allocation specific to each department, and taking into account the performance of each resource as it depends upon the functionality of material handling (which relies on a department's size). In addition, the terms "dynamicity" and related language are intended to highlight the unpredictable nature of human, robot, and plant interaction in connection with the overall facility and system described.

Referring back to FIG. 1A, in some embodiments, certain data may be received from or sent to a plurality of devices 202 (e.g., any computing device, tablet, mobile phone, or the like) via a network 204. In these embodiments for example, the devices 202 may send or otherwise make data available to the computing device 101, such data relating to a facility where it is desired to generate an optimal layout and identify optimal resource allocation for that facility. In these embodiments, the devices 202 may communicate with the computing device 101 via a user interface 206 accessible via a mobile app, browser, or any other known method for providing aspects of the framework 100 to the devices 202. In a specific example, one of the devices 202 may send information about a Facility A and a target production threshold for the facility to the computing device 101 including information about an initial layout of the Facility A. The computing device 101, configured with the simulation model 102 and the optimization algorithms 104 described herein, may process the information received using the simulation model 102 and the optimization algorithms 104 and output a layout redesign 108 for the Facility A that meets the target production threshold. The computing device 101 may also be provided as part of Software as a Service (SaaS), or be made accessible to other devices in a cloud, or otherwise be made accessible for use.

Figure 15:
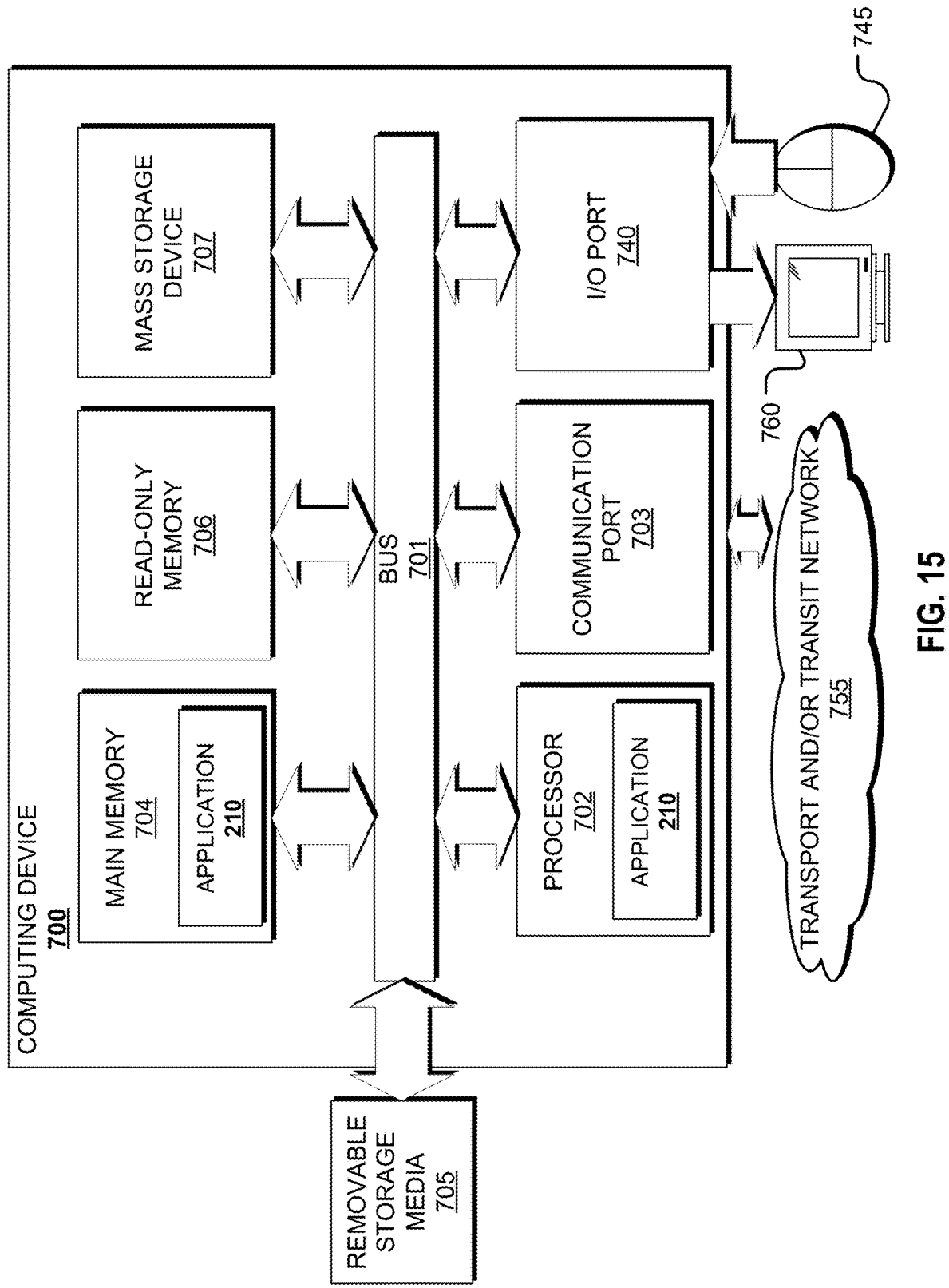
FIG. 15 illustrates an exemplary computing device configured for implementing functionality associated with the framework configured for simulation-based resource and layout optimization described herein.

FIG. 15 is an example schematic diagram of a computing device 700 that may implement various methodologies discussed herein. For example, the computing device 700 may execute the framework 100 in the form of an application 210, and the computing device 700 and the application 210 may be configured to implement the functionality associated with the framework configured for simulation-based resource and layout optimization described herein. The computing device 700 includes a bus 701 (i.e., interconnect), at least one processor 702 or other computing element, at least one communication port 703, a main memory 704, a removable storage media 705, a read-only memory 706, and a mass storage device 707. Processor(s) 702 can be any known processor, such as, but not limited to, an Intel® Itanium® or Itanium 2® processor(s), AMD® Opteron® or Athlon MP® processor(s), or Motorola® lines of processors. Communication port 703 can be any of an RS-232 port for use with a modem based dial-up connection, a 10/100 Ethernet port, a Gigabit port using copper or fiber, or a USB port. Communication port(s) 703 may be chosen depending on a network such as a Local Area Network (LAN), a Wide Area Network (WAN), or any network to which the computer device 700 connects. Computing device 700 may further include a transport and/or transit network 755, a display screen 760, an I/O port 740, and an input device 745 such as a mouse or keyboard.

Main memory 704 can be Random Access Memory (RAM) or any other dynamic storage device(s) commonly known in the art. Read-only memory 706 can be any static storage device(s) such as Programmable Read-Only Memory (PROM) chips for storing static information such as instructions for processor 702. Mass storage device 707 can be used to store information and instructions. For example, hard disks such as the Adaptec® family of Small Computer Serial Interface (SCSI) drives, an optical disc, an array of disks such as Redundant Array of Independent Disks (RAID), such as the Adaptec® family of RAID drives, or any other mass storage devices, may be used.

Bus 701 communicatively couples processor(s) 702 with the other memory, storage, and communications blocks. Bus 701 can be a PCI/PCI-X, SCSI, or Universal Serial Bus (USB) based system bus (or other) depending on the storage devices used. Removable storage media 705 can be any kind of external hard drives, thumb drives, Compact Disc-Read Only Memory (CD-ROM), Compact Disc-Re-Writable (CD-RW), Digital Video Disk-Read Only Memory (DVD-ROM), etc.

Embodiments herein may be provided as a computer program product, which may include a machine-readable medium having stored thereon instructions which may be used to program a computer (or other electronic devices) to perform a process. The machine-readable medium may include, but is not limited to optical discs, CD-ROMs, magneto-optical disks, ROMs, RAMs, erasable programmable read-only memories (EPROMs), electrically erasable programmable read-only memories (EEPROMs), magnetic or optical cards, flash memory, or other type of media/machine-readable medium suitable for storing electronic instructions. Moreover, embodiments herein may also be downloaded as a computer program product, wherein the program may be transferred from a remote computer to a requesting computer by way of data signals embodied in a carrier wave or other propagation medium via a communication link (e.g., modem or network connection).

As shown, main memory 704 may be encoded with the application 210 that supports functionality discussed above. In other words, aspects of the application 210 (and/or other resources as described herein) can be embodied as software code such as data and/or logic instructions (e.g., code stored in the memory or on another computer readable medium such as a disk) that supports processing functionality according to different embodiments described herein. During operation of one embodiment, processor(s) 702 accesses main memory 704 via the use of bus 701 in order to launch, run, execute, interpret, or otherwise perform processes, such as through logic instructions, executing on the processor 702 and based on the application 210 stored in main memory or otherwise tangibly stored.

The description above includes example systems, methods, techniques, instruction sequences, and/or computer program products that embody techniques of the present disclosure. However, it is understood that the described disclosure may be practiced without these specific details. In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

Certain embodiments may be described herein as including one or more modules. Such modules are hardware-implemented, and thus include at least one tangible unit capable of performing certain operations and may be configured or arranged in a certain manner. For example, a hardware-implemented module may comprise dedicated circuitry that is permanently configured (e.g., as a special-purpose processor, such as a field-programmable gate array (FPGA) or an application-specific integrated circuit (ASIC)) to perform certain operations. A hardware-implemented module may also comprise programmable circuitry (e.g., as encompassed within a general-purpose processor or other programmable processor) that is temporarily configured by software or firmware to perform certain operations. In some example embodiments, one or more computer systems (e.g., a standalone system, a client and/or server computer system, or a peer-to-peer computer system) or one or more processors may be configured by software (e.g., an application or application portion) as a hardware-implemented module that operates to perform certain operations as described herein.

Accordingly, the term "hardware-implemented module" or "module" encompasses a tangible entity, be that an entity that is physically constructed, permanently configured (e.g., hardwired), or temporarily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules may provide information to, and/or receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation, and may store the output of that operation in a memory device to which it is communicatively coupled. A further hardware-implemented module may then, at a later time, access the memory device to retrieve and process the stored output. Hardware-implemented modules may also initiate communications with input or output devices.

It is believed that the present disclosure and many of its attendant advantages should be understood by the foregoing description, and it should be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it should be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method for computerized layout-based resource allocation, comprising:
utilizing at least one processor configured to perform operations associated with a simulation-based optimization framework operable to simultaneously find an optimal layout design for a facility and optimal resource allocation for the facility, including:
accessing data including a plurality of parameters for generating an initial layout for a plurality of departments of a facility and a resource allocation defining a predetermined number of resources assigned to the plurality of departments of the facility;
defining a simulation model comprising a plurality of processes, wherein each of the plurality of processes is handled by a specific set of the predetermined number of resources;
applying a layout redesign algorithm to the data to generate a layout redesign, the layout redesign defining locations and sizes for each of the plurality of departments for the facility; and
applying a layout improvement algorithm to information associated with the layout redesign to identify possible exchanges to adjacent departments of the layout redesign that minimize material handling cost,
wherein the layout redesign algorithm further includes:
estimating the sizes based on the predetermined number of resources assigned to each of the plurality of departments and a preassigned space within each department assigned to each resource,
iteratively ranking each of the plurality of departments based on commutation scores computed for the plurality of departments, and
identifying the locations based on the sizes and the commutation scores.

2. The method of claim 1, further comprising:
computing material handling time parameters based on a rectilinear distance between a centroid of each department of the layout redesign, and
applying the material handling time parameters to the simulation model to output a production value for comparison with a predetermined targeted production value to maximize production output for the facility.

3. The method of claim 1, wherein the data includes a first dataset defining information about dynamicity of worker performance, and a second dataset defining dynamicity of plant propagation such that the resource allocation and the layout redesign consider both dynamicity of human and plant behavior.

4. The method of claim 1, wherein the layout redesign algorithm further includes mapping the locations of the plurality of departments of the layout redesign along the facility, by:
   selecting a first department of the facility; and
   identifying a second department to be mapped adjacent to the first department based on a commutation score, the second department having a highest commutation exchange with the first department.

5. The method of claim 1, wherein the layout redesign minimizes material handling time and design impact, the material handling time being a summation over all commutation between different departments of the layout redesign considering a frequency and a distance of each origin-destination pair, the design impact based on a number of corners for each department of the layout redesign to define a realistic design.

6. The method of claim 5, wherein effect of the material handling time and design impact is normalized using a plurality of predetermined weights.

7. A method for computerized layout-based resource allocation, comprising:
   utilizing at least one processor configured to perform operations associated with a simulation-based optimization framework operable to simultaneously find an optimal layout design for a facility and optimal resource allocation for the facility, including:
      accessing data including a plurality of parameters for generating an initial layout for a plurality of departments of a facility and a resource allocation defining a predetermined number of resources assigned to the plurality of departments of the facility;
      defining a simulation model comprising a plurality of processes, wherein each of the plurality of processes is handled by a specific set of the predetermined number of resources;
      applying a layout redesign algorithm to the data to generate a layout redesign, the layout redesign defining locations and sizes for each of the plurality of departments for the facility; and
      applying a layout improvement algorithm to information associated with the layout redesign to identify possible exchanges to adjacent departments of the layout redesign that minimize material handling cost,
   wherein the layout improvement algorithm further includes:
      evaluating possible modifications to the layout redesign to minimize a total cost, by completing steps including:
         (i) defining centroids of each of the departments of the layout redesign, and
         (ii) calculating an initial cost considering inter department rectilinear distances, commute scores, and a quantity of corners in each department; and
      evaluating a possible exchange of a first department of the layout redesign with a second department adjacent to the first department;
      repeating steps (i) through (ii) for departments affected by the exchange to compute an updated cost which improves upon the initial cost,
      modifying the layout redesign to reflect the exchange between the first department of the layout redesign with the second department to minimize the total cost.

* * * * *